US 9,581,655 B2

(12) United States Patent
Tanaka et al.

(10) Patent No.: US 9,581,655 B2
(45) Date of Patent: Feb. 28, 2017

(54) LIGHTING APPARATUS

(71) Applicant: Rohm Co., Ltd., Kyoto (JP)

(72) Inventors: Masahide Tanaka, Osaka (JP); Mitsunori Nagashima, Kyoto (JP); Akinobu Sawada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 323 days.

(21) Appl. No.: 14/217,618

(22) Filed: Mar. 18, 2014

(65) Prior Publication Data

US 2014/0197840 A1    Jul. 17, 2014

Related U.S. Application Data

(63) Continuation of application No. 13/111,482, filed on May 19, 2011, now Pat. No. 8,710,995.

(30) Foreign Application Priority Data

May 20, 2010 (JP) .................................. 2010116578
May 26, 2010 (JP) .................................. 2010120740
May 31, 2010 (JP) .................................. 2010123678

(51) Int. Cl.
*G08B 21/00* (2006.01)
*G01R 31/36* (2006.01)
*H05B 33/08* (2006.01)
*H05B 37/02* (2006.01)

(52) U.S. Cl.
CPC ..... *G01R 31/3679* (2013.01); *H05B 33/0884* (2013.01); *H05B 37/0272* (2013.01)

(58) Field of Classification Search
None
See application file for complete search history.

(56) References Cited

U.S. PATENT DOCUMENTS

| 5,703,469 | A | * | 12/1997 | Kinoshita | G01R 31/361 |
| | | | | | 320/152 |
| 6,160,380 | A | * | 12/2000 | Tsuji | B60L 11/1851 |
| | | | | | 320/132 |
| 6,433,512 | B1 | * | 8/2002 | Birkler | G01R 31/3679 |
| | | | | | 320/132 |
| 7,573,396 | B2 | * | 8/2009 | Stokes | B64D 11/00 |
| | | | | | 307/10.8 |
| 7,683,580 | B2 | * | 3/2010 | Matsushima | G01R 31/3658 |
| | | | | | 320/132 |
| 7,948,398 | B2 | * | 5/2011 | Miller | H05B 33/0803 |
| | | | | | 340/653 |
| 8,018,208 | B1 | * | 9/2011 | Kahn | H02M 3/156 |
| | | | | | 323/224 |

(Continued)

FOREIGN PATENT DOCUMENTS

| EP | 1881743 | 1/2008 |
| JP | 2001-185374 | 7/2001 |

(Continued)

*Primary Examiner* — Travis Hunnings
(74) *Attorney, Agent, or Firm* — Fish & Richardson P.C.

(57) ABSTRACT

A lighting apparatus of the present invention includes: a light source; a power source unit arranged to power the light source; a detector unit arranged to detect the deterioration of ability of the power source unit to power the light source; and a determination unit arranged to determine the life of the power source unit in response to the detector unit.

13 Claims, 15 Drawing Sheets

(56) References Cited

U.S. PATENT DOCUMENTS

| | | | |
|---|---|---|---|
| 2005/0027466 A1* | 2/2005 | Steinmetz | H04M 1/24 702/63 |
| 2007/0040696 A1* | 2/2007 | Mubaslat | G01R 31/2635 340/657 |
| 2007/0046263 A1* | 3/2007 | Matsushima | G01R 31/3658 320/132 |
| 2008/0101078 A1* | 5/2008 | Stokes | B64D 11/00 362/470 |
| 2009/0009362 A1* | 1/2009 | Miller | H05B 33/0803 340/907 |
| 2014/0067295 A1* | 3/2014 | Putman | G06Q 50/06 702/61 |

FOREIGN PATENT DOCUMENTS

| | | |
|---|---|---|
| JP | 2003-68475 | 3/2003 |
| JP | 2004-335426 | 11/2004 |
| JP | 2006-085344 | 3/2006 |
| JP | 2006-236666 | 9/2006 |
| JP | 2006-289192 | 10/2006 |
| JP | 2006-302840 | 11/2006 |
| JP | 2007-115594 | 5/2007 |
| JP | 2008-041650 | 2/2008 |
| JP | 2008-042060 | 2/2008 |
| JP | 2009-156639 | 7/2009 |
| JP | 2009-158116 | 7/2009 |
| JP | 2009-238755 | 10/2009 |
| JP | 2009-289453 | 12/2009 |
| JP | 2010-034240 | 2/2010 |

* cited by examiner

LIGHTING APPARATUS

CROSS-REFERENCE TO RELATED APPLICATIONS

This application is a continuation of U.S. application Ser. No. 13/111,482, filed May 19, 2011, which in turn claims the benefit of foreign priority of the following Japanese Applications:

(1) Japanese Patent Application No. 2010-116578 filed on May 20, 2010
(2) Japanese Patent Application No. 2010-120740 filed on May 26, 2010
(3) Japanese Patent Application No. 2010-123678 filed on May 31, 2010
the contents of which are hereby incorporated by reference.

BACKGROUND OF THE INVENTION

1. Field of the Invention

The present invention relates to lighting apparatuses.

2. Description of Related Art

A lighting apparatus is a typical electrical device. A fluorescent lamp is usually used as a light source of the lighting apparatus; in recent years, more and more LEDs have been utilized, and thus it is proposed that a white LED is configured to be compatible with the fluorescent lamp and that the white LED is used for general ceiling illumination (JP-A-2004-335426). On the other hand, various proposals have been made as to control of the lighting apparatus. For example, it is proposed that IC tag seals attached to a large number of fluorescent lamps and an IC tag reader/writer which covers an entire building with electromagnetic communication communicate with each other, and thus, when each fluorescent lamp has been used for a predetermined period of time since the start of use of the fluorescent lamp, a notification of its replacement is automatically provided (JP-A-2006-85344). Furthermore, it is proposed on illumination using LEDs that the chronological change level of an LED chip is determined based on a relationship between the value of a current flowing through the LED chip and an optical output of the LED chip detected by an optical detection element and characteristic data obtained by making such a relationship correspond to the chronological change level, and a notification of this level is provided from a lighting apparatus to a controller, and the level is displayed (JP-A-2010-34240).

However, with respect to the management of electrical devices such as a lighting apparatus (for example, the management of the life of a lighting apparatus), there are a large number of problems with which to further cope with

SUMMARY OF THE INVENTION

In view of the foregoing problem found by the applicant, an object of the present invention is to provide a lighting apparatus that can perform appropriate life management.

To achieve the above object, according to the present invention, there is provided a lighting apparatus for illumination with a light source including: a power source unit arranged to power the light source; a detector unit arranged to detect the deterioration of ability of the power source unit to power the light source; and a determination unit arranged to determine duration of life of the power source unit in response to the detector unit.

Other features, elements, steps, advantages and characteristic of the present invention will be further obvious from the following detailed description of preferred embodiments and the corresponding accompanying drawings.

DETAILED DESCRIPTION OF PREFERRED EMBODIMENTS

First Embodiment

Figure 1:
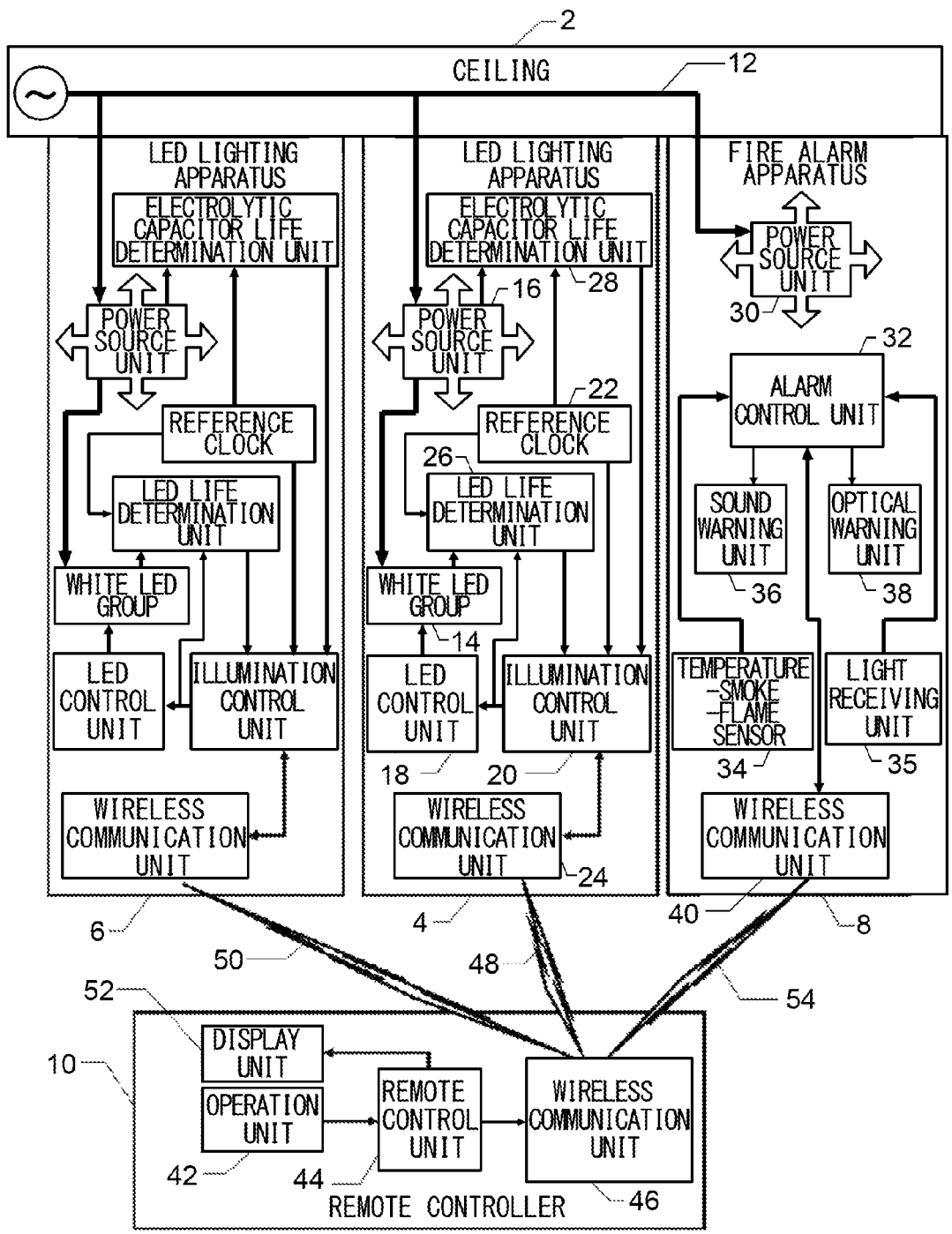
FIG. 1 A block diagram showing a first embodiment of an LED lighting system according to embodiments of the present invention (first embodiment)

FIG. 1 is a block diagram showing a first embodiment of an LED lighting system according to embodiments of the present invention. The lighting system of the first embodiment includes: an LED lighting apparatus 4 provided on a ceiling 2; an LED lighting apparatus 6 provided on the ceiling 2; a fire alarm apparatus 8 provided on the ceiling 2; and a remote controller 10 that collectively controls these apparatuses. Although, in an enterprise office or the like, a large number of lighting apparatuses are arranged on the ceiling 2, only two lighting apparatuses are shown in FIG. 1 as representatives for ease of illustration. The LED lighting apparatuses 4 and 6 and the fire alarm apparatus 8 are powered by an electrical power line 12. On the other hand, the remote controller 10 is battery-operated. The LED lighting apparatuses 4 and 6 and the fire alarm apparatus 8 communicate with the remote controller 10 by infrared wireless communication or near field radio wireless communication that will be described later. When the remote controller 10 is operated through a power line by being fixed to a room wall or the like, the LED lighting apparatuses 4 and 6, the fire alarm apparatus 8 and the remote controller 10 can be configured so that the lighting apparatuses 4 and 6 and the fire alarm apparatus 8 communicate with the remote controller 10 by power line communication (PLC).

The LED lighting apparatus 4 is configured such that, when its life ends, the LED lighting apparatus 4 can be removed from the ceiling 2 and replaced; the LED lighting apparatus 4 has a white LED group 14 as an illumination light source. The white LED group 14 is powered from a power source unit 16 connected to the electrical power line 12, is controlled in light intensity by an LED control unit 18 and thereby emits light. The power source unit 16 supplies an electric power having a predetermined voltage not only to the white LED group 14 but also to the individual portions of the LED lighting apparatus 4. An illumination control unit 20 has a microcomputer operated by a reference clock 22 and a predetermined program, provides instructions to turn on and off the white LED group through the LED control unit 18 based on a remote control signal received by a wireless communication unit 24 and to adjust light intensity, and manages the life of the LED lighting apparatus 4. The illumination control unit 20 has a storage unit that stores the program of the microcomputer and the data necessary for processing. The wireless communication unit 24 may be configured as a near field radio communication unit.

An LED life determination unit 26 determines the life of the white LED group 14 based on instruction signals, from the illumination control unit 20 to the LED control unit 18, for the turning on and off and the light intensity adjustment, the temperature of the white LED group 14 and the reference clock 22, and transmits its result to the illumination control unit 20. An electrolytic capacitor life determination unit 28 determines the life of an electrolytic capacitor included in the power source unit 16 based on the ability of rectification and smoothing of the power source unit 16 and the reference clock 22, and transmits its result to the illumination control unit 20. When the illumination control unit 20 determines that the life ends, an instruction to turn off the white LED group 14 is provided to the LED control unit 18. Since the configuration of the LED lighting apparatus 6 is the same as that of the LED lighting apparatus 4, the provision of a symbol in the figure and its description are omitted.

Although the life determination and the management discussed above are described in detail later, the significance thereof will be described here, While, advantageously, an LED lighting apparatus having a life that is significantly longer than that of a common fluorescent lamp tube does not need to be replaced for a long period of time, memory and record on the previous replacement is highly likely to be lost, and it is problematic to manage the subsequent replacement time. Since, in a common fluorescent lamp tube, an obvious failure is found in the lighting at the end of the life or the lighting is impossible to perform, the need for the replacement is clearly found. By contrast, in the LED lighting apparatus, brightness is gradually reduced as it is used for a long period of time but an obvious failure or a state where the lighting cannot be performed is not found. Hence, it is likely that a person who performs an operation or lives in the dimly lit area described above cannot realize the reduction in brightness and consequently the person performs an operation or lives in a dimly lit area under unhealthy conditions without realizing it. The life determination and the management are a significant measure to cope with such a problem.

The fire alarm apparatus 8 has a power source unit 30 that is connected to the electrical power line 12 and that supplies a power having a predetermined voltage to the portions of the fire alarm apparatus 8. The power source unit 30 may be battery-operated. An alarm control unit 32 issues a warning through a sound warning unit 36 and an optical warning unit 38 based on the detection by a temperature-smoke-flame sensor 34 at the time of abnormality. A wireless communication unit 40 connected to the alarm control unit 32 transmits an abnormal state to the outside, and communicates with the outside when the fire alarm apparatus 8 is tested. The alarm control unit 32 is provided with a light receiving unit 35 that performs the function of the fire alarm apparatus 8 itself and that is also powered from the power source unit 30, and detects an illumination within a room. Information on the illumination within the room detected by the light receiving sensor 35 serves as information for automatic light intensity adjustment performed by the LED lighting apparatuses 4 and 6 as will be described later. Since the light receiving unit 35 powered by the power source unit 30 is used for light intensity adjustment on a daily basis, the power source unit 30 of the fire alarm apparatus 8, which is not operated for a long period of time as long an abnormal state is not found, is checked on a daily basis, with the result that an failure to perform the operation when it needs to be performed is prevented.

The remote controller 10 has an operation unit 42 for performing a manual operation, and a remote control unit 44 controls a wireless communication unit 46 based on the operation of the operation unit 42 to transmit infrared light 48 and/or infrared light 50 to the LED lighting apparatus 4 and/or the wireless communication unit 24 of the LED lighting apparatus 6. When the wireless communication unit 24 and the wireless communication unit 46 are configured as the near field radio communication unit, the infrared light 48 and the infrared light 50 are replaced with ratio waves. In these wireless communication units 24 and 46, a one-way instruction can be provided from the remote controller 10 to the LED lighting apparatuses 4 and 6 and moreover, two-way communication can be performed, and the information on the life of the LED lighting apparatuses 4 and 6 can be received by the remote controller 10 and displayed on a display unit 52. The two-way communication function and the display function of the display unit 52 described above are also utilized in the tests of the life determination units 26 and 28. When normal lighting or light intensity adjustment control is performed, the display unit 52 is also utilized as a graphical user interface (GUI) that works in corporation with the operation unit 42. Furthermore, the remote controller 10 relays the information on the illumination within the room from the light receiving unit 35 of the fire alarm apparatus 8 as automatic light intensity adjustment information to the LED lighting apparatuses 4 and 6.

The remote controller 10 is also used in the test of the fire alarm apparatus 8. In the test, based on the operation of the GUI by the operation unit 42 and the display unit 52, the remote control unit 44 instructs the wireless communication unit 46 to transmit a test instruction signal of infrared light 54. The transmitted test instruction signal is received by the wireless communication unit 40 of the fire alarm apparatus 8. Based on this, the alarm control unit 32 performs a predetermined test, and instructs the wireless communication unit 40 to transmit a test result signal of the infrared light 54. The test result signal of the infrared light 54 is received by the remote controller 10, and is displayed on the display unit 52 through control by the remote control unit 44. The test of the fire alarm apparatus 8 as described above is performed in corporation with the tests of the LED lighting apparatuses 4 and 6. The details thereof will be described later.

Figure 2:
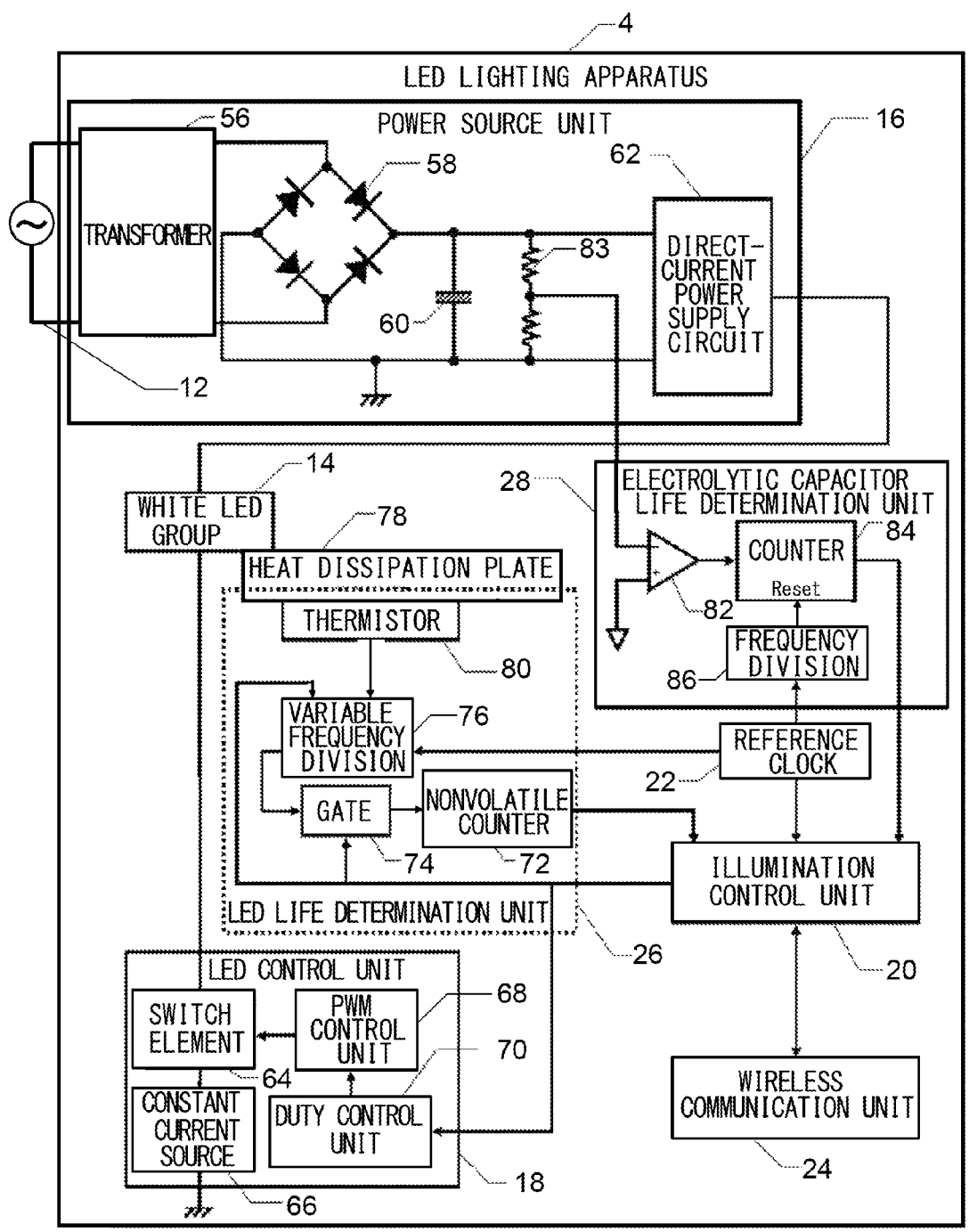
FIG. 2 A block diagram showing the detailed configuration of the LED lighting apparatus of FIG. 1.

FIG. 2 is a block diagram showing the detailed configuration of the LED lighting apparatus of FIG. 1. The same parts as shown in FIG. 1 are identified with identical reference numerals, and their description will not be repeated as long as it is not needed. In the power source unit 16, an alternating current of the electrical power line 12 is stepped down by a transformer 56, is rectified by a full-wave rectifier 58, is smoothed out by an electrolytic capacitor 60 and is supplied to a direct-current power supply circuit 62. The white LED group 14, a switch element 64 and a constant current source 66 are connected in series between the direct-current power supply circuit 62 and ground. The turning on and off of the switch element 64 is controlled by a PWM control unit 68, and thus the turning on and off of the white LED group 14 and the light intensity adjustment when the white LED group 14 is turned on are performed. The duty cycle of the PWM control by the PWM control unit 68 is given by a duty control unit 70 based on an instruction signal from the illumination control unit 20. That the duty cycle is zero means that the white LED group 14 is turned off. The switch element 64, the constant current source 66, the PWM control unit 68 and the duty control unit 70 constitute the LED control unit 18.

A nonvolatile counter 72 of the LED life determination unit 26 counts clock pulses from the reference clock 22 frequency divided by a variable frequency division unit 76 through a gate 74 that is opened when a turn-on signal (signal other than duty zero) is output from the illumination control unit 20. Thus, the nonvolatile counter 72 accumulatively counts and stores the time during which the white LED group 14 is turned on. When the nonvolatile counter 72 counts pulses corresponding to the time when the life of the white LED group 14 is assumed to come to an end (for example, brightness of light emitted by the same input is reduced to 70% of that of a new one), an over flow pulse is output to the illumination control unit 20, and thus this is assumed to be the determination of the life of the LEDs.

The turn-on signal is input from the illumination control unit 20 to the variable frequency division unit 76, and the frequency of an output pulse is increased as the duty cycle of the turn-on signal is higher, with the result that the count by the nonvolatile counter 72 is made to proceed more quickly. This copes with a case where, as the energy of the current flowing through the white LED group 14 is larger, the life ends more quickly. A thermistor 80 is provided on a heat dissipation plate 78 of the white LED group 14, and detects the state of heat dissipation. The temperature detected by the thermistor 80 is input to the variable frequency division unit 76, and the frequency of the output pulse is increased as the temperature is higher, with the result that the count by the nonvolatile counter 72 is made to proceed more quickly. This copes with a case where, as the temperature of the white LED group 14 when it is heated is higher, the life ends more quickly.

A comparator 82 of the electrolytic capacitor life determination unit 28 compares, with a reference voltage, a division voltage (division voltage of the smoothed voltage generated with the electrolytic capacitor 60) generated by a detection resistor 83, and generates, when a low voltage portion of the division voltage that is brought into the state of a pulsating current due to the reduced smoothing ability of the electrolytic capacitor 60 becomes lower than the reference voltage, an output in synchronization with the pulsating current. A counter 84 counts this, and outputs the over flow pulse to the illumination control unit 20, and thus this is assumed to be the determination of the life of the electrolytic capacitor. The clock pulse from the reference clock 22 is input to the reset terminal of the counter 84 through a frequency division unit 86. Thus, the counter 84 is periodically reset (for example, when the counter 84 is configured such that an overflow thereof occurs at 128 pulse counts, one reset is performed per second), and an overflow of the counter 84 is prevented from occurring as long as the pulse based on the pulsating current from the comparator 82 does not continue for about a little less than one second. Hence, when the smoothing ability of the electrolytic capacitor 60 is reliably reduced, this is assumed to be the end of the life, and an erroneous operation is prevented such as a case where a noise pulse, such as when the division voltage generated by the detection resistor 83 is temporarily reduced, is determined to be the end of the life as the accumulative count.

Figure 3:
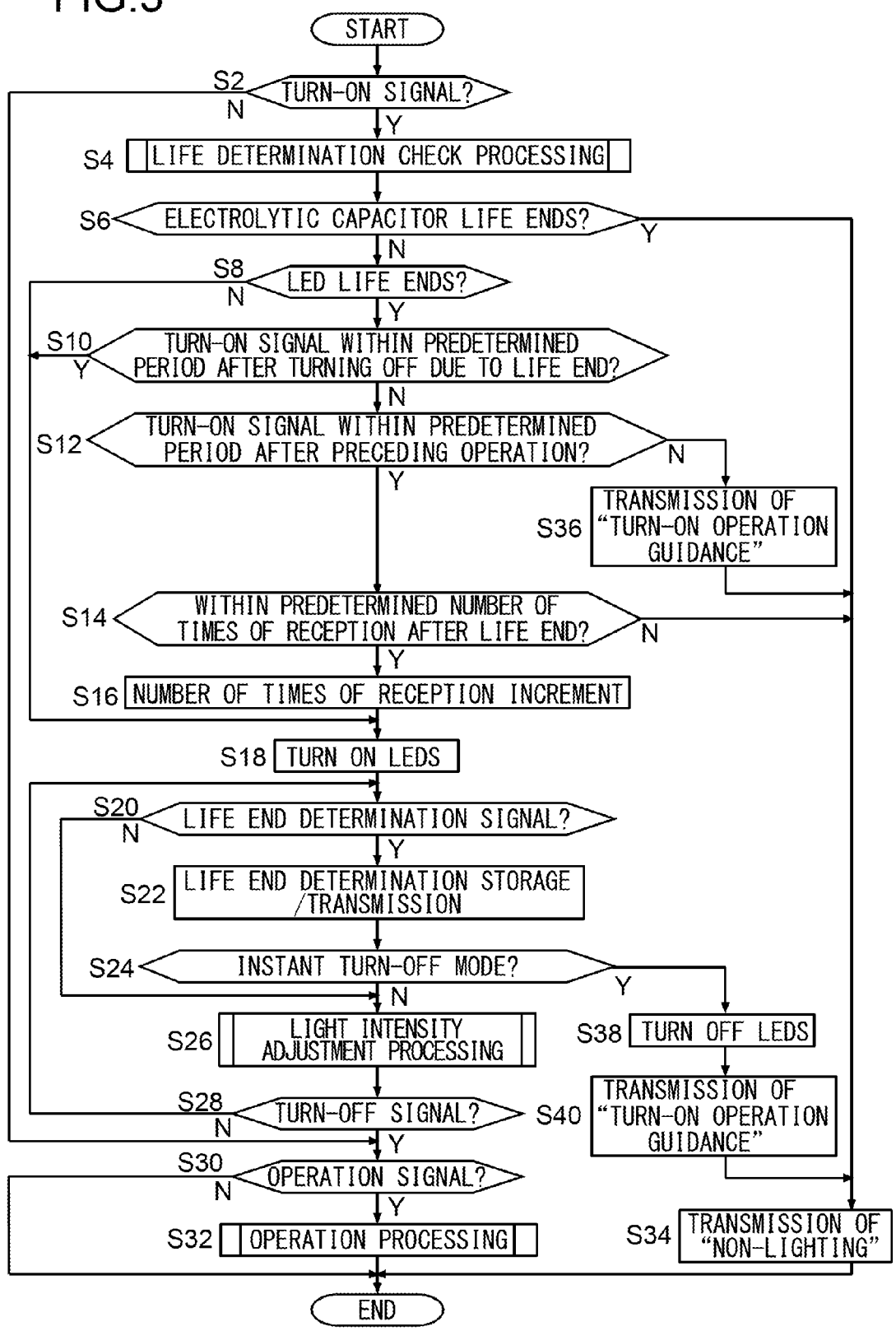
FIG. 3 A flowchart showing the basic function of an illumination control unit shown in FIGS. 1 and 2.

FIG. 3 is a flowchart showing the basic function of the illumination control unit 20 shown in FIGS. 1 and 2. The flow starts when an operation signal such as the turn-on signal from the remote controller 10 or a life determination function test signal is received. When the flow starts, whether or not the turn-on signal is received is checked in step S2, and, if the turn-on signal is received, the process proceeds to step S4 where life determination check processing is performed and the process proceed to step S6. The life determination check processing in step S4 is processing for checking whether or not the determination as to whether the life of the electrolytic capacitor 60 ends or whether the life of the white LED group 14 ends is performed; its details will be described later.

In step S6, as a result of the life determination check in step S4, whether or not the determination as to whether the life of the electrolytic capacitor 60 ends is performed is checked, and, if the determination is not performed, the process proceeds to step S8 where, as a result of the life determination check in step S4, whether or not the determination as to whether the life of the white LED group 14 ends is performed is checked. If the life of the white LED group 14 is determined to end, the process proceeds to step S10 where whether or not the turn-on signal recognized to be received in step S2 is a turn-on signal within a predetermined period of time (for example, 30 seconds) after the white LED group 14 is determined to end and then the LED lighting apparatus 4 is automatically turned off is checked. This is because, in an instant turn-off mode, which will be described later, when the lit LED lighting apparatus 4 is suddenly automatically turned off according to the determination that its life ends, relighting is allowed by performing a turn-on operation within a predetermined period of time.

If the operation is not the operation corresponding to step S10, the process proceeds to step S12 where whether or not the turn-on signal recognized to be received in step S2 is received within a predetermined period of time (for example, 1 second) after the preceding operation is checked. This is performed so that, even if the life of the white LED group 14 is determined to end and the LED lighting apparatus 4 is not turned on by a normal turn-on operation, lighting can be carried out by performing a special operation, that is, continuously performing an operation at the intervals of one second or less. If the operation is the operation corresponding to step S12, the process proceeds to step S14 where, after the life of the white LED group 14 is determined to end, whether or not the operation is an operation of a predetermined number of times (for example, five times) or less is checked. This is performed so that, for ease of use, even if the life of the white LED group 14 ends, lighting performed by the special operation that is the continuous operation is allowed but a predetermined limit is placed on the number of times and the turn-on operation is prevented from being continued for a long time even though the life of the white LED group 14 ends.

If, in step S14, the operation is the operation of the predetermined number of times or less, the process proceeds to step S16 where the number of times of reception of an operation signal is incremented one time and the process proceeds to step S18 where the white LED group 14 is turned on. On the other hand, if, in step S8, the life of the white LED group 14 is not determined to end, the process directly moves to step S18 where the white LED group 14 is immediately turned on. If, in step S10, the white LED group 14 is recognized, by the life determination, to be a turn-on signal of the predetermined period of time or less after the automatic turning off, the process also directly proceeds to step S18 where the white LED group 14 is turned on.

If, in step S18, the white LED group 14 is turned on, the process proceeds to step S20 where whether or not a determination signal indicating that the life of the electrolytic capacitor 60 or the white LED group 14 ends while it is being kept on is generated is generated is checked. Then, if the determination signal indicating that the life ends is generated, in step S22, the result of this determination is stored and is transmitted to the remote controller 10, and the process moves to step S24. In step S24, whether or not a mode in which the determination signal indicating that the life ends is generated and the white LED group 14 is instantly turned off is set is checked. If the mode is not the instant turn-off mode, the white LED group 14 is not turned off at this time, and the process proceeds to step aS26. Since the determination that the life ends is stored in step S22, when the turn-on operation is performed next time, this is checked by checking in step S4, and, unless this corresponds to step S10 or to both steps S12 and S14, lighting cannot be performed. On the other hand, if, in step S20, the signal indicating that the life ends is not generated, the process directly moves to step S26.

In step S26, light intensity adjustment processing for automatic or manual light intensity adjustment is performed. The details thereof will be described later. If the light intensity adjustment processing is completed, the process proceeds to step S28 where whether or not the turn-off signal is received from the remote controller 10 is checked. If the turn-off signal is not received, the process returns to step S20, and thereafter, unless the turn-off signal is received and the signal indicating the life ends is generated in the instant turn-off mode, processing from step S20 to S28 is repeated to correspond to the light intensity adjustment control or the variation of the state of the life. On the other hand, if, in step S28, the turn-off signal is recognized to be received, the process moves to step S30. If, in step S2, the turn-on signal is not recognized to be received, the process moves to step S30.

In step S30, whether or not a signal resulting from an operation such as a life determination test signal or a pseudo life end limit signal, which will be described later, is received is checked. Then, if this signal is recognized to be received, operation processing in step S32 is performed and the flow is completed. On the other hand, if the operation signal is not recognized to be received in step S30, the flow is immediately completed.

Here, if, in step S6, the life of the electrolytic capacitor 60 is determined to end, the process moves to step S34 where information indicating "non-lighting" is transmitted to the remote controller 10, and the flow is immediately completed. Here, if comparison with a case where the life of the white LED group 14 ends is made, in this case, the amount of light emission is simply insufficient and this is not urgent, and hence, for convenience of use, as already described, re-lighting is allowed under a predetermined limitation. However, in a case where the life of the electrolytic capacitor 60 ends, in consideration of a slight possibility that an unexpected event such as the occurrence of ignition is encountered due to continuous use, means for allowing re-lighting is not provided unlike the case where the life of the white LED group 14 ends.

The following description is also related to what has been described above, and, if, when the life of the white LED group 14 ends, in step S12, it is not detected that the signal is the turn-on signal within a predetermined period of time after the preceding operation, the process proceeds to step S36 where an instruction signal of a guidance display saying that continuous operation allows lighting to be performed up to a predetermined number of times is transmitted to the remote controller 10, and the process moves to step S34. On the other hand, if, in step S14, it is detected that lighting is carried out by performing continuous operation a predetermined number of times or more, the process immediately moves to step S34. In both cases, the lighting corresponding to the turn-on operation is not performed. If, in step S24, the mode is the instant turn-off mode, the process moves to step S38 where the white LED group 14 is instantly turned off, and, in step S40, an instruction signal of a guidance display saying that, when the turn-on operation is performed within a predetermined period of time, the re-lighting can be performed is transmitted to the remote controller 10 and the process moves to step S34.

Figure 4:
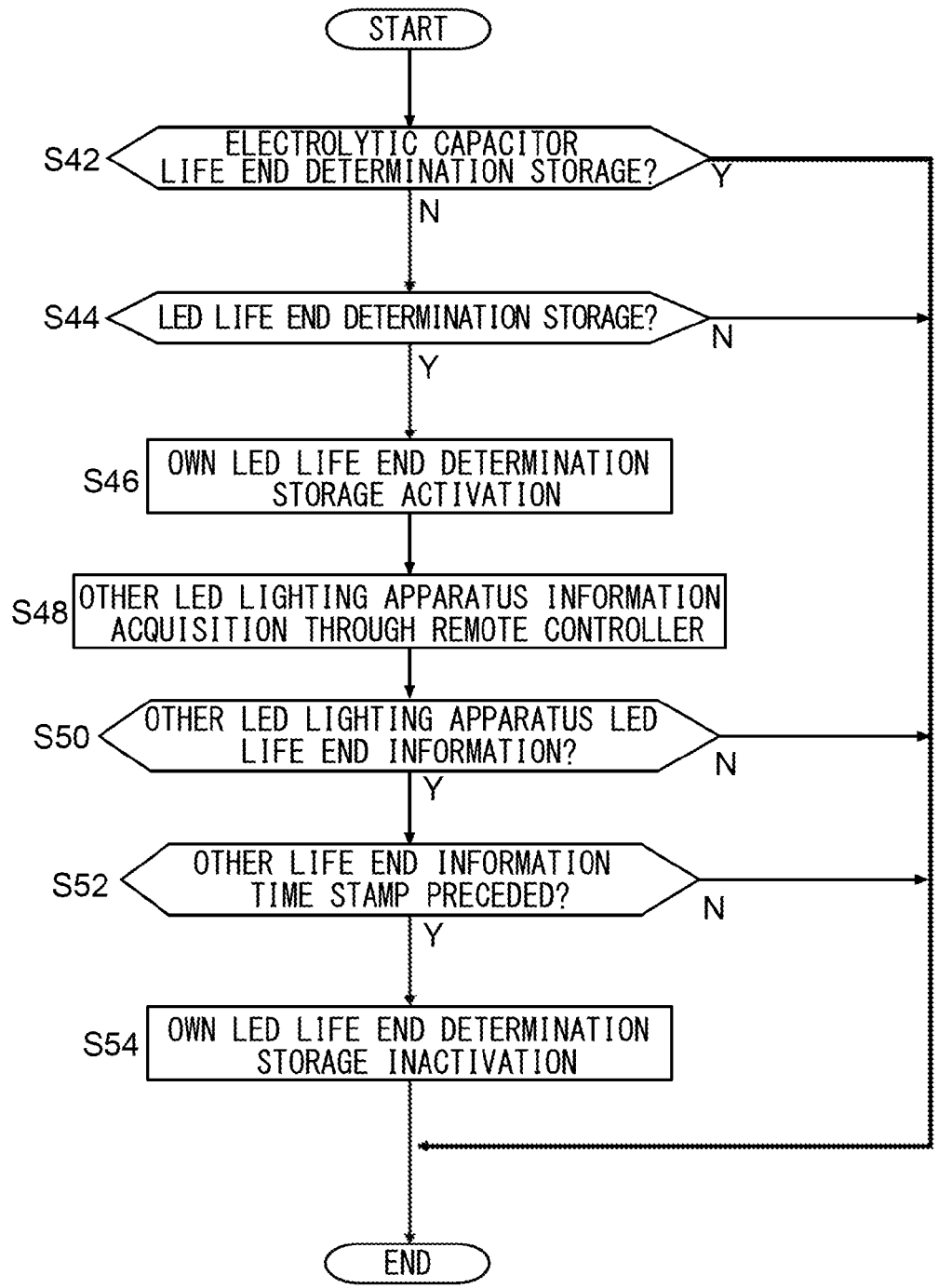
FIG. 4 A flowchart showing the details of step S4 of FIG. 3.

FIG. 4 is a flowchart showing the details of the life determination check processing in step S4 of FIG. 3. When the flow starts, in step S42, whether or not the determination that the life of the electrolytic capacitor 60 ends is stored is checked. If this memory is not present, the process proceeds to step S44 where whether or not the determination that the life of the white LED group 14 ends is stored is checked. If this memory is recognized to be present, the process proceeds to step S46 where an LED life end determination memory in its own LED lighting apparatus 4 is first activated, and the process moves to step S48.

Then, in step S48, information on another LED lighting apparatus 6 is acquired through the remote controller 10, and, in step S50, whether or not information indicating that the life of LEDs in the another LED lighting apparatus (for example, the LED lighting apparatus 6) ends is present is checked. Then, if the corresponding information is present, in step S52, whether or not a time stamp of the information that the life of LEDs in the another LED lighting apparatus ends precedes a time stamp of the information that the life of LEDs in the own LED lighting apparatus 4 ends is checked. Consequently, if the time stamp in the another LED lighting apparatus precedes, the process proceeds to step S54 where the LED life end determination memory in the own LED lighting apparatus 4 is inactivated, and the flow is completed.

As described above, in the life determination check flow, information is exchanged with the another LED lighting apparatus within the same room, thus as long as an LED lighting apparatus in which the life of LEDs ends before is present, a notification of the end of the life through non-lighting is left to the LED lighting apparatus for the time being, the LED life end determination memory in the own LED lighting apparatus 4 is inactivated, the life is assumed not to end and lighting is allowed. In this way, a plurality of LED lighting apparatuses within the same room are prevented from being simultaneously turned off due to the end of the life of LEDs, and the LED lighting apparatus with the oldest time stamp is only turned off as a representative and thus a notification of the end of life is provided. Then, when the older LED lighting apparatus is replaced and the time stamp of the own LED lighting apparatus 4 becomes the oldest, a determination memory indicating that the life of LEDs ends is activated and the turning off is performed.

On the other hand, if, in step S42, the life of the electrolytic capacitor 60 ends, a high priority is given to safety as compared with the inconvenience in which a plurality of LED lighting apparatuses are simultaneously turned off, and, in the own LED lighting apparatus 4, a memory indicating that the life of the electrolytic capacitor 60 ends is always activated. If, in step S44, a memory indicating that the life of the white LED group 14 ends is not present, the flow is immediately completed. If, in step S50, information indicating that the life of LEDs ends in the another LED lighting apparatus is not present, or if, in step S52, the another LED lighting apparatus in which the life of LEDs ends and which has an older time stamp is not present, the activation of the LED life end memory in the own LED lighting apparatus 4 in step S46 is maintained and the flow is completed.

Figure 5:
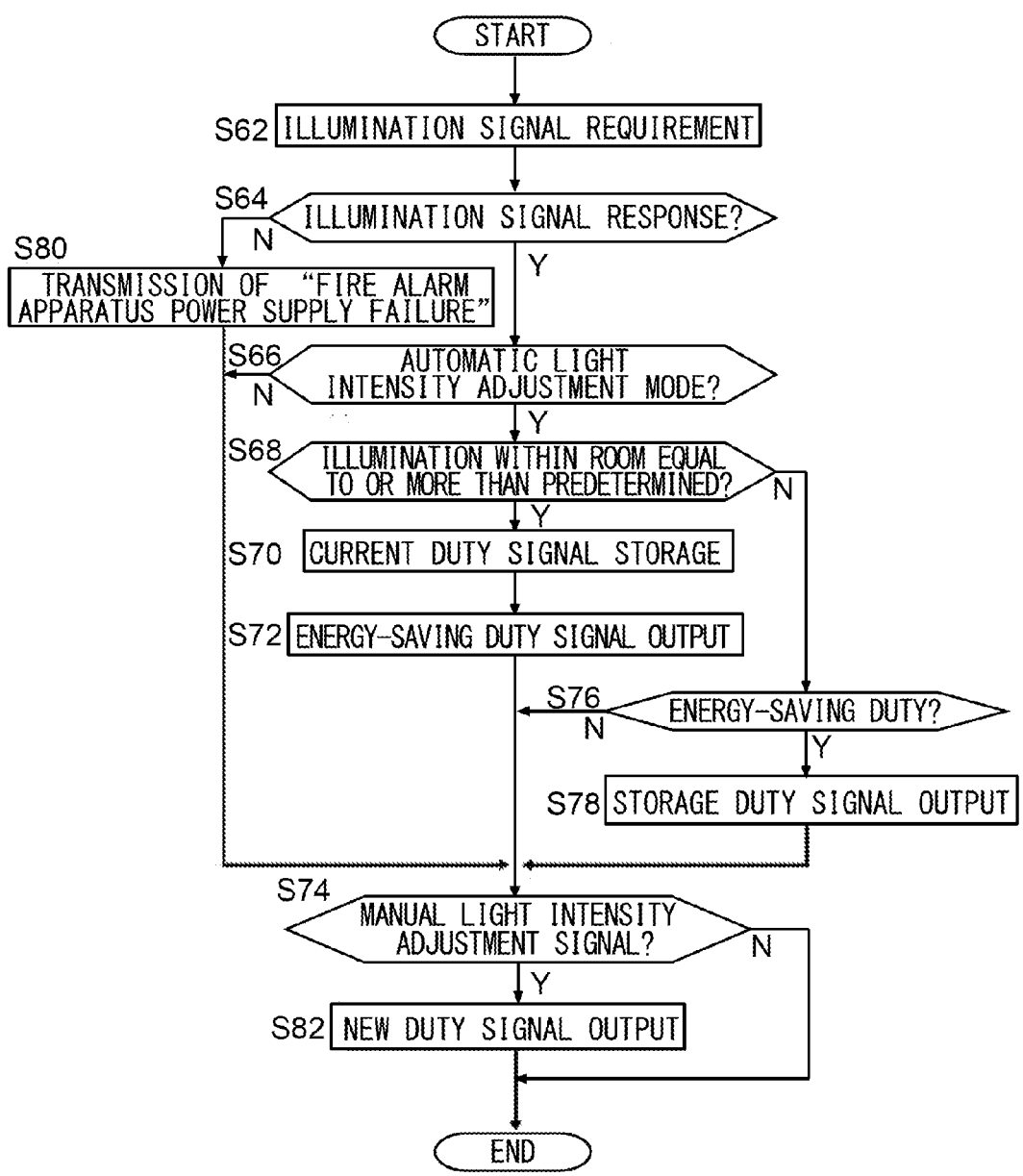
FIG. 5 A flowchart showing the details of step S26 of FIG. 3.

FIG. 5 is a flowchart showing the details of the light intensity adjustment in step S26 of FIG. 3. When the flow starts, in step S62, the fire alarm apparatus 8 is required through the remote controller 10 to provide an illumination signal. Then, the process proceeds to step S64 where whether or not a response to the illumination signal measured by the light receiving unit 35 is received through the remote controller 10 from the fire alarm apparatus 8 is checked. If the response is received, the process proceeds to step S66 where whether or not the LED lighting apparatus 4 is set in an automatic light intensity adjustment mode is checked. Then, if the LED lighting apparatus 4 is set in the automatic light intensity adjustment mode, the process proceeds to step S68 where whether or not the illumination within the room measured by the fire alarm apparatus 8 is equal to or more than a predetermined one is checked. Consequently, if the illumination within the room is equal to or more than the predetermined one, the process proceeds to step S70 where a current duty signal is stored and, instead of this, an energy-saving duty signal is output in step S72, and the process proceeds to step S74. The energy-saving duty signal generally indicates a duty cycle smaller than the duty signal stored in step S70; when the room is brighter than a predetermined brightness and additional illumination is unnecessary, light emission from the LED lighting apparatus 4 is automatically reduced, with the result that it contributes to energy saving.

On the other hand, if, in step S68, the illumination within the room is not detected to be equal to or more than the predetermined one, the process proceeds to step S76 where whether or not the energy-saving duty cycle is currently applied is checked. If the energy-saving duty cycle is applied, the process proceeds to step S78 where the duty signal stored before the energy-saving duty cycle is applied is read and output, and the process moves to step S74. On the other hand, if, in step S76, the application of the energy-saving duty cycle is not detected, the process directly moves to step S74. As described above, if the brightness within the room is equal to or less than the predetermined one, lighting is performed with a general duty cycle whereas if the energy-saving duty is applied, a return to the lighting with the normal duty cycle is performed. If, in step S66, the mode is not detected to be the automatic light intensity adjustment mode, the automatic light intensity adjustment is not performed regardless of the illumination signal to which the response is made in step S64, and the process directly moves to step S74.

If, in step S64, the response to the illumination signal is not detected, power supply for achieving the function of the light receiving unit 35 of the fire alarm apparatus 8 probably has a problem. Since the light receiving unit 35 receives both power through the functional portion of the fire alarm apparatus 8 itself such as the temperature-smoke-flame sensor 34 and power from the common power source unit 30, when the power supply to the light receiving unit 35 has a problem, the power supply to the functional portion of the fire alarm apparatus 8 itself probably has a problem, too. Hence, if, in step S64, the response to the illumination signal is not detected, the process moves to step S80 where information indicating "fire alarm apparatus power supply failure" is transmitted to the remote controller 10, and the process moves to step S74. As described above, the light receiving unit 35 provided in the fire alarm apparatus 8 is used for the light intensity adjustment, and thus the operation of the fire alarm apparatus 8, which is desired not to be performed for a long period of time is checked on a daily basis, with the result that the failure of the operation when it is necessary is prevented.

In step S74, whether or not a manual light intensity adjustment signal generated based on the operation of the operation unit 42 of the remote controller 10 is received is checked. Then, if the manual light intensity adjustment signal is received, the process proceeds to step S82 where a new duty cycle signal based on a manual setting is output, and the flow is completed. Although, as described above, in the light intensity adjustment processing, the brightness of the LED lighting apparatus 4 can be changed automatically or manually, when the illumination within the room is equal to or more than the predetermined one in the automatic light intensity adjustment mode, a higher priority is given to the energy-saving duty. Regardless of the setting of the automatic light intensity adjustment mode, the fire alarm apparatus 8 is constantly checked with the illumination signal.

Figure 6:
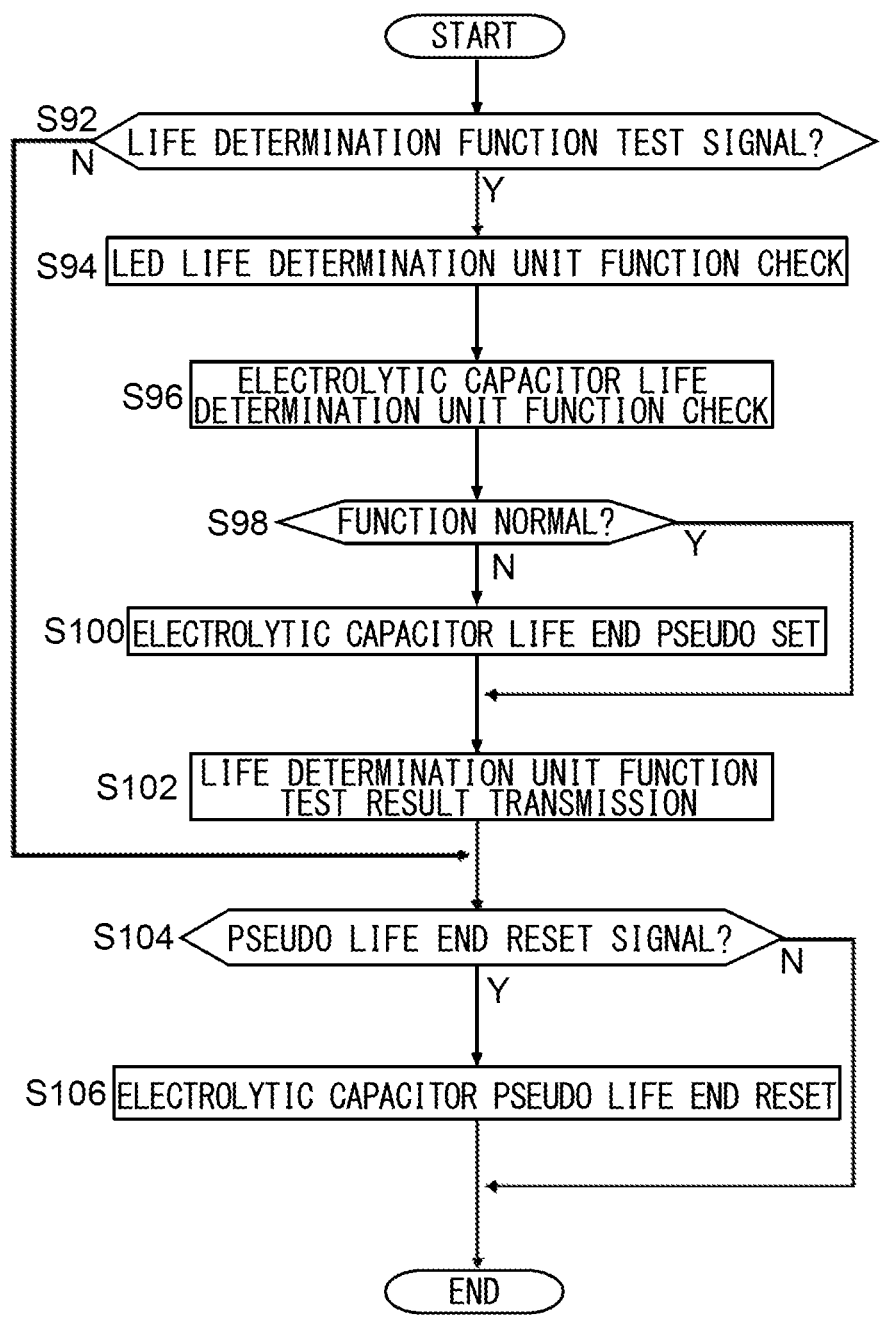
FIG. 6 A flowchart showing the details of step S32 of FIG. 3.

FIG. 6 is a flowchart showing the details of the operation processing in step S32 of FIG. 3. When the flow starts, first, in step S92, whether or not an operation signal received from the remote controller 10 is an instruction signal for the test of a life determination function is checked. If the operation signal is the function test signal, first, in step S94, the function of the LED life determination unit 26 is checked. This check includes, for example, a passage test of a pulse from the reference clock 22 to the variable frequency division unit 76 and the gate 74, a frequency division ratio change function test of the variable frequency division unit 76 and the counting of the nonvolatile counter 72 with a count value temporarily put aside and an overflow test.

Furthermore, in step S96, the function of the electrolytic capacitor life determination unit 28 is checked. This check includes, for example, the comparison function check of the comparator 82, the counting of the counter 84 and the overflow test. Then, in step S98, based on the results of these function checks, whether or not all functions of the life determination unit are normal is checked. Then, if a failure is found, the process proceeds to step S100 where a pseudo state where the life of the electrolytic capacitor 60 ends is set, and the process proceeds to step S102. On the other hand, if, in step S98, all functions of the life determination unit are recognized to be normal, the process directly proceeds to step S102 with being further treated.

If the pseudo state which is set in step S100 as described above and in which the life of the electrolytic capacitor ends is checked in step S6, the function of moving the flow to step S34 is held. In this case, when the functions of the life determination unit are not normal, the LED lighting apparatus 4 is not turned on even by performing the turn-on operation. If the pseudo state where the life of the electrolytic capacitor ends is checked in step S20, in the instant turn-off mode, the flow is moved to step S38 through step S24. In this case, the failure of the functions of the life determination unit causes the LED lighting apparatus 4 being kept on to be instantly turned off through a test operation. In both cases, the non-lighting or the turning off of the LED lighting apparatus 4 described above is performed, and thus a notification of the failure of the functions of the life determination unit is provided without failing to recognize any failure.

In step 102, test results of the life determination functions of the white LED group 14 and the electrolytic capacitor 60 based on the checks in steps S94 and S96 are specifically transmitted to the remote controller 10, and the process moves to step S104. Since the remote controller 10 displays this information on the display unit 52, an operator who performs the test operation can specifically find the results. If, in step S92, the operation signal received from the remote controller 10 is not detected to be an instruction signal for the test of the life determination function, the flow directly moves to step S104.

In step S104, whether or not the operation signal received from the remote controller 10 is the pseudo life end limit signal is checked. If so, the process proceeds to step S106 where the electrolytic capacitor pseudo life end limit state that is set is reset, and the flow is completed. On the other hand, if the received operation signal is not the pseudo life end limit signal, the flow is immediately completed. Since, as described above, the electrolytic capacitor pseudo life end limit state set in step S100 causes the non-lighting or the turning off of the LED lighting apparatus 4, when the cause thereof is found and the LED lighting apparatus 4 is turned on for the time being, this is reset and thus it is possible to turn on the LED lighting apparatus 4. For this purpose, the reset signal detected in step S104 is transmitted by a manual operation from the remote controller 10.

Figure 7:
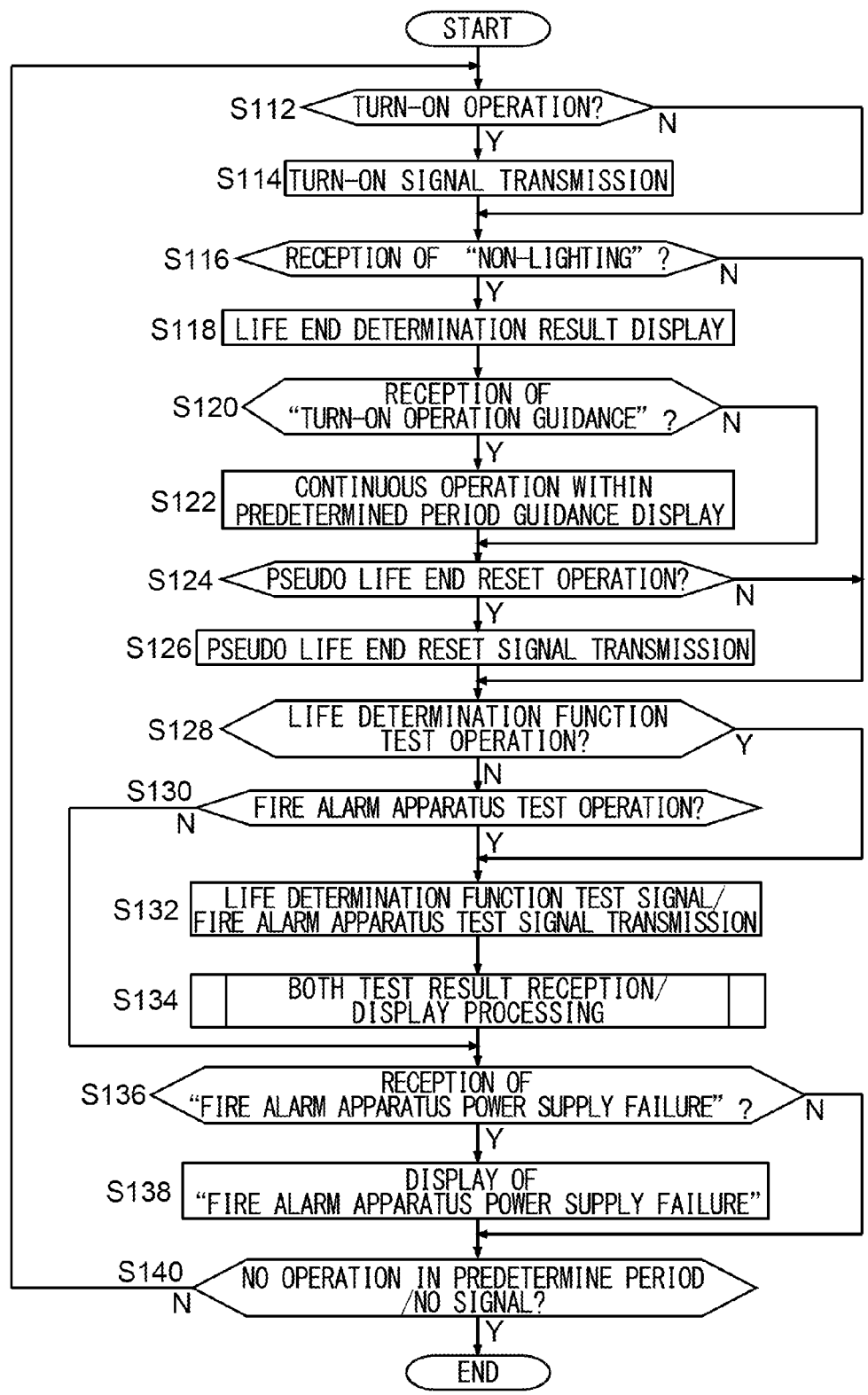
FIG. 7 A flowchart showing the function of a remote control unit shown in FIG. 1.

FIG. 7 is a flowchart showing the function of the remote control unit 44 shown in FIG. 1. The flow is started either by performing the operation of the operation unit 42 for operating the LED lighting apparatuses 4 and 6 or the fire alarm apparatus 8 or by the reception of a signal by the wireless communication unit 46 from the LED lighting apparatuses 4 and 6 or the fire alarm apparatus 8. When the flow starts, first, in step S112, whether or not the turn-on operation is performed is checked. If the turn-on operation is performed, the process proceeds to step S114 where the turn-on signal is transmitted to the LED lighting apparatus 4 and the LED lighting apparatus 6, and the process moves to step S116. On the other hand, if, in step S112, the turn-on operation is not detected, the process immediately moves to step S116.

In step S116, whether or not a signal indicating "non-lighting" is received from any of the LED lighting apparatuses 4 and 6 and the like is checked. If the signal is received, the process proceeds to step S118 where the received life end determination result is displayed on the display unit 52. Then, in step S120, whether or not a signal indicating that "turn-on operation guidance" is performed is received from the LED lighting apparatuses 4 and 6 and the like is checked.

If the signal is received, the process proceeds to step S122 where an instruction to produce a display saying the "lighting can be performed if the operation is continuously performed within a predetermined period of time" is provided to the display unit 52, and the process moves to step S124. On the other hand, if, in step S120, the reception of the signal indicating that "turn-on operation guidance" is performed is not detected, the process directly moves to step S124.

In step S124, when the pseudo life end limit state set based on the life determination function test result causes the "non-lighting" or the turning off of the LED lighting apparatuses 4 an 6, whether or not an operation for resetting this is performed is checked, and, if the operation is performed, the process proceeds to step S126 where a signal for resetting the pseudo life end limit state is transmitted to the corresponding LED lighting apparatus, and the process moves to step S128. On the other hand, if, in step S124, the reset operation is not detected, the process directly moves to step S128.

If, in step S116, the reception of the signal indicating "non-lighting" is not detected, the process directly moves to step S128, too. Hence, in this case, the guidance display in step S122 is not produced, and thus it is possible to avoid confusion resulting from an unnecessary display. Since the pseudo life end reset operation is not checked in step S124, the response to the erroneous operation of the pseudo life end reset is prevented from causing the function to be confused.

In step S128, whether or not an operation for testing the life determination function of the LED lighting apparatuses 4 and 6 is performed is checked. If this operation is not detected, the process proceeds to step S130 where whether or not an operation for testing the fire alarm apparatus 8 is performed is checked. In both cases where, in step S128, the life determination function test operation is detected and where, in step S130, the fire alarm apparatus test operation is detected, the process proceeds to step S132 where a life determination function test signal is transmitted to the LED lighting apparatuses 4 and 6 and a fire alarm apparatus test signal is transmitted to the fire alarm apparatus 8. In step S134, the results of the function tests are received from the LED lighting apparatuses 4 and 6 and the fire alarm apparatus 8, and these are displayed side by side on the display unit 52, and the process moves to step S136. On the other hand, if, in both steps S128 and S130, no test operations are detected, the process directly moves to step S136.

As described above, in the flow of FIG. 7, even when any of the test operations is performed, the test of the life determination function of the LED lighting apparatuses 4 and 6 and the test of the fire alarm apparatus 8 are performed as a pair without fail, and the results thereof are displayed side by side. Although the end of the life of the LED lighting apparatuses 4 and 6 and a notification of fire through the fire alarm apparatus 8 are desired not to be performed for a long period of time, it is inevitable to perform tests in order to guarantee the function when it is necessary. The above configuration has the following significance: even when, while one of the tests is being performed without any attention being paid, the other test is performed, both of them are performed and displayed as a pair, thus the opportunities of checking whether they are normally performed are increased and attention is called so that one of the tests is prevented from being badly treated. Although steps S128 and S130 are related to the detection function of a manual operation, step S132 may be additionally performed every predetermined period (for example, once every year), and signals of the tests may be transmitted. In this case, the results of the tests are also displayed side by side in step 134, and thus attention is called to the necessity of the tests as a pair. The failure of the power source unit 16 of the LED lighting apparatuses 4 and 6 can cause a fire, and the fire alarm apparatus 8 is related to the notification of the fire, which is an unlikely event, with the result that the cooperation of the tests is significant.

In step S136, whether or not "fire alarm apparatus power supply failure" is received from the LED lighting apparatuses 4 and 6 is checked. Then, if it is received, the process moves to step S138 where the information indicating "fire alarm apparatus power supply failure" is displayed, and the process moves to step S140. On the other hand, if, in step S136, the reception of the signal is not detected, the process directly moves to step S140. In step S140, whether or not the operation of a predetermined period or the reception of the signal is not continuously performed is checked, and, if so, the flow is completed. On the other hand, if any operation within the predetermined period or the reception of the signal is performed, the process returns to step S112. Thereafter, unless the operation of the predetermined period or the reception of the signal is not performed, steps S112 to S140 are repeated.

Various features of the present invention are not limited to the first embodiment described above; other embodiments utilizing the advantages are possible. For example, although, in the first embodiment described above, the white LED group 14 is not turned on or the white LED group 14 being kept on is turned off so that a notification indicating that the life of the white LED group 14 or the electrolytic capacitor 60 ends is provided, instead, when the life of the white LED group 14 or the electrolytic capacitor 60 ends, a notification may be provided such as by the blinking of the white LED group 14, that is, unusual lighting. For example, the period of the blinking of the unusual lighting is changed depending on whether the life of the white LED group 14 ends or the life of the electrolytic capacitor 60 ends, and thus it is possible to provide a notification so as to identify the two cases. Furthermore, the unusual lighting of the white LED group 14 performed when a failure occurs in the life detection function is made to differ from the unusual lighting performed when the life of the white LED group 14 or the electrolytic capacitor 60 ends, and thus it is possible to provide a notification so as to identify the functional failure.

Even in the case where, instead of the detection of the life of LEDs through accumulative counting in the state in which energy is supplied to the white LED group 14 as in the first embodiment, a light receiving unit for actually monitoring the state of light emission of the white LED group 14 is provided, and, based on a relationship between the supply of energy to the white LED group 14 and light emission from the white LED group 14, the life of LEDs is detected, various features after the detection of the life of LEDs of the present invention can be applied. Furthermore, various features of the present invention related to the life of the electrolytic capacitor can be applied to lighting apparatuses other than the LED lighting apparatus such as a fluorescent lamp lighting apparatus.

Although, in the first embodiment, as shown in FIG. 4, exchange of information with other LED lighting apparatuses prevents a plurality of LED lighting apparatuses from being simultaneously turned off within the same room due to the end of the life of LEDs, the prevention of the simultaneous turning off resulting from the end of the life of LEDs is not limited to the means described above. For example, the nonvolatile counter 72 shown in FIG. 2 is set such that,
when, at the time when the lighting time period of the white LED group 14 is assumed to reach 40,000 hours (brightness of light emitted by the same input is reduced to 70% of that of a new one), the number of corresponding pulses is counted, the overflow pulse is generated. Here, an additional count time component is provided in the nonvolatile counter 72, and the LED lighting apparatuses are shipped with settings being made such that the additional count times of the LED lighting apparatuses randomly vary within about plus or minus 100 hours. Thus, even if a plurality of LED lighting apparatuses within the same room are turned on under the same conditions for the same number of hours, their lives are not determined to end at the same time period, and the LED lighting apparatuses are turned off with the variations described above. In this way, it is possible to prevent a plurality of LED lighting apparatuses within the same room from being turned off at the same time period due to the end of the life of LEDs, and consequently, a sufficient time period for replacing the LED lighting apparatus that is first turned off is given and then the subsequent LED lighting apparatus is turned off.

Second Embodiment

Figure 8:
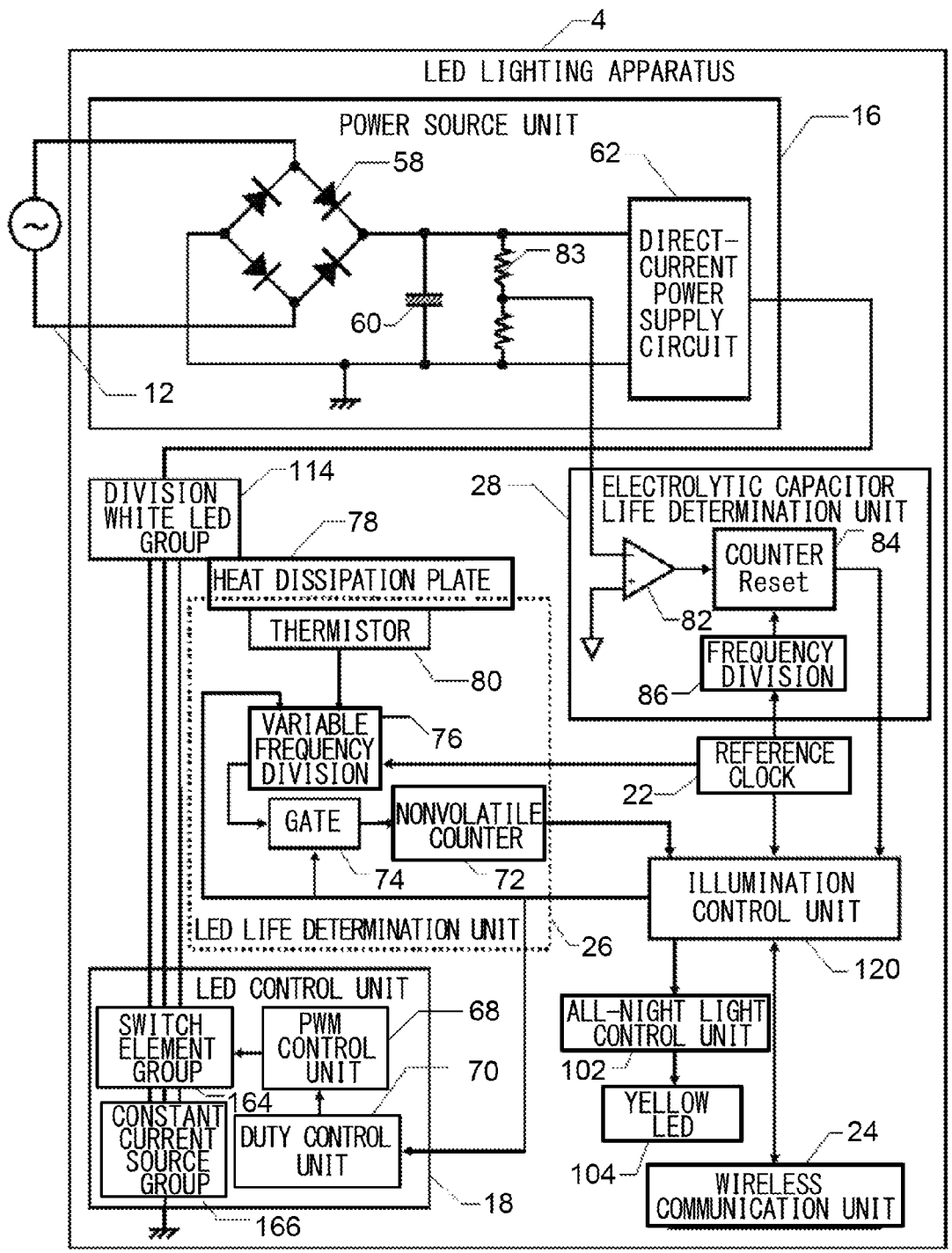
FIG. 8 A block diagram showing the detailed configuration of an LED lighting apparatus of a second embodiment of the LED lighting system according to embodiments of the present invention (second embodiment)

FIG. 8 is a block diagram showing the detailed configuration of an LED lighting apparatus of a second embodiment of the LED lighting system according to the embodiments of the present invention. Since the entire system is basically the same as in the first embodiment, FIG. 1 is also used. In FIG. 8, the same parts as in FIG. 2 are identified with common reference numerals, and their descriptions will not be repeated unless necessary.

The first point of the second embodiment of corresponding FIG. 8 which is different from the first embodiment is that the white LED group is replaced by a division white LED group 114, and thus a switch element group 164 and a constant current source group 166 can independently perform light intensity adjustment on each division part. In this way, the white LED group 114 can turn on part thereof and turn off the other parts or turn on parts with a gradation. Hence, when the division white LED groups of a plurality of LED lighting apparatuses are seamlessly arranged in line, the boundary between a turn-on part and a turn-off part can be formed halfway through the LED lighting apparatus instead of being formed between the LED lighting apparatuses, and a gradual gradation can be produced over a plurality of LED lighting apparatuses arranged in line. Since the division parts of the division white LED group 114 are independently turned on and off or turned on with different levels of brightness, based on a plurality of duty cycle signals output from the duty control unit 70 based on an instruction from an illumination control unit 120, the PWM control unit 68 independently controls corresponding switch elements in the switch element group 164. These are disclosed in Japanese Patent Application Nos. 2009-127206 and 2009-147167 filed by the same applicant. A variety of lighting functions of the division white LED group 114 as described above supply various types of illumination at the time of normal illumination, and are also utilized for providing a unique notification when the life of the LED lighting apparatus 4 ends. The details thereof will be described later.

In the second embodiment, an all-night light control unit 102 that is controlled by the illumination control unit 120 and a yellow LED 104 that is turned on and off by this are provided. The all-night light control unit 102 turns on, according to the operation of the remote controller 10, the yellow LED 104, as an all-night light, with a small amount of power, instead of the division white LED group 114 that is turned off at the time of, for example, bedtime. The all-night light control unit 102 and the yellow LED 104 are utilized, as described above, as an all-night light at the time of normal use, and are also utilized when a unique notification is provided at the time of the end of the life of the LED lighting apparatus 4. The details thereof will be described later. In the second embodiment, as shown in FIG. 8, the transformer 56 of FIG. 1 is omitted, and the full-wave rectifier 58 is powered directly from the electrical power line 12; whether the transformer 56 is present or not does not particularly come from the difference between the first embodiment and the second embodiment.

Figure 9:
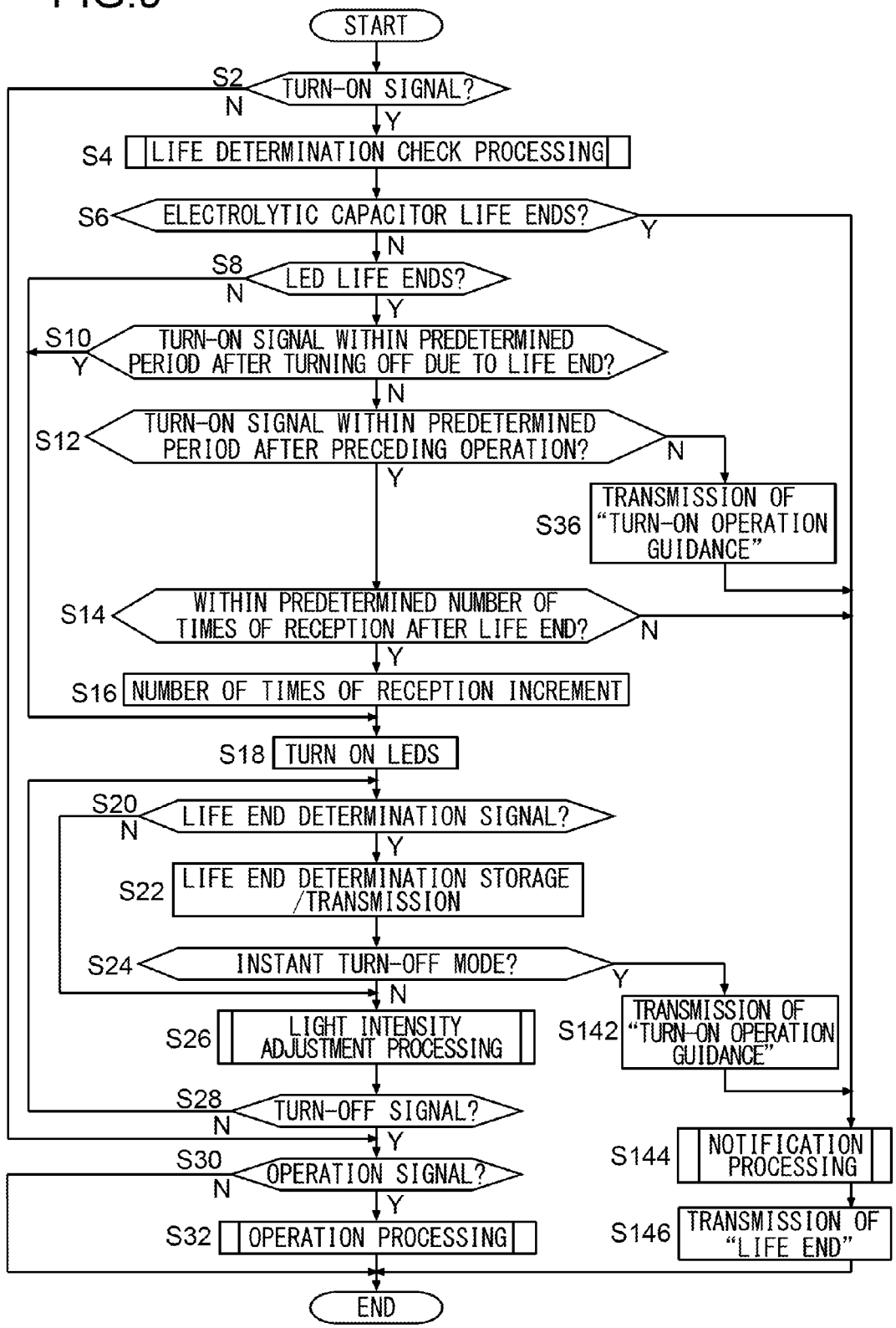
FIG. 9 A flowchart showing the basic function of an illumination control unit shown in FIGS. 1 and 8 and according to the second embodiment.

FIG. 9 is a flowchart showing the basic function of the illumination control unit 120 of the second embodiment shown in FIGS. 1 and 8. Since most of the details thereof are the same as the flow of FIG. 3 in the first embodiment, corresponding steps are identified with common step numbers, and their description will not be repeated. The flow of FIG. 9 differs from that of FIG. 3 in steps indicated by thick lines in FIG. 9 in which a notification is provided such as when the life of the LED lighting apparatus 4 ends. Specifically, as shown in FIG. 9, if, in step S6, the life of the electrolytic capacitor 60 is determined to end, the process moves to step S144 where processing for providing a notification indicating the end of the life or the like is performed. In step S146, information indicating that "life ends" is transmitted to the remote controller 10, and the flow is completed. In step S20, a determination signal indicating that the life of the LED lighting apparatus 4 ends is detected, and thus, if, in step S24, the mode is the instant turn-off mode, the process moves to step S142 where an instruction signal of a guidance display saying that relighting can be performed by conducting the turn-on operation is transmitted to the remote controller 10, and the process moves to step S144. The details of notification processing in step S144 will be described later.

Figure 10:
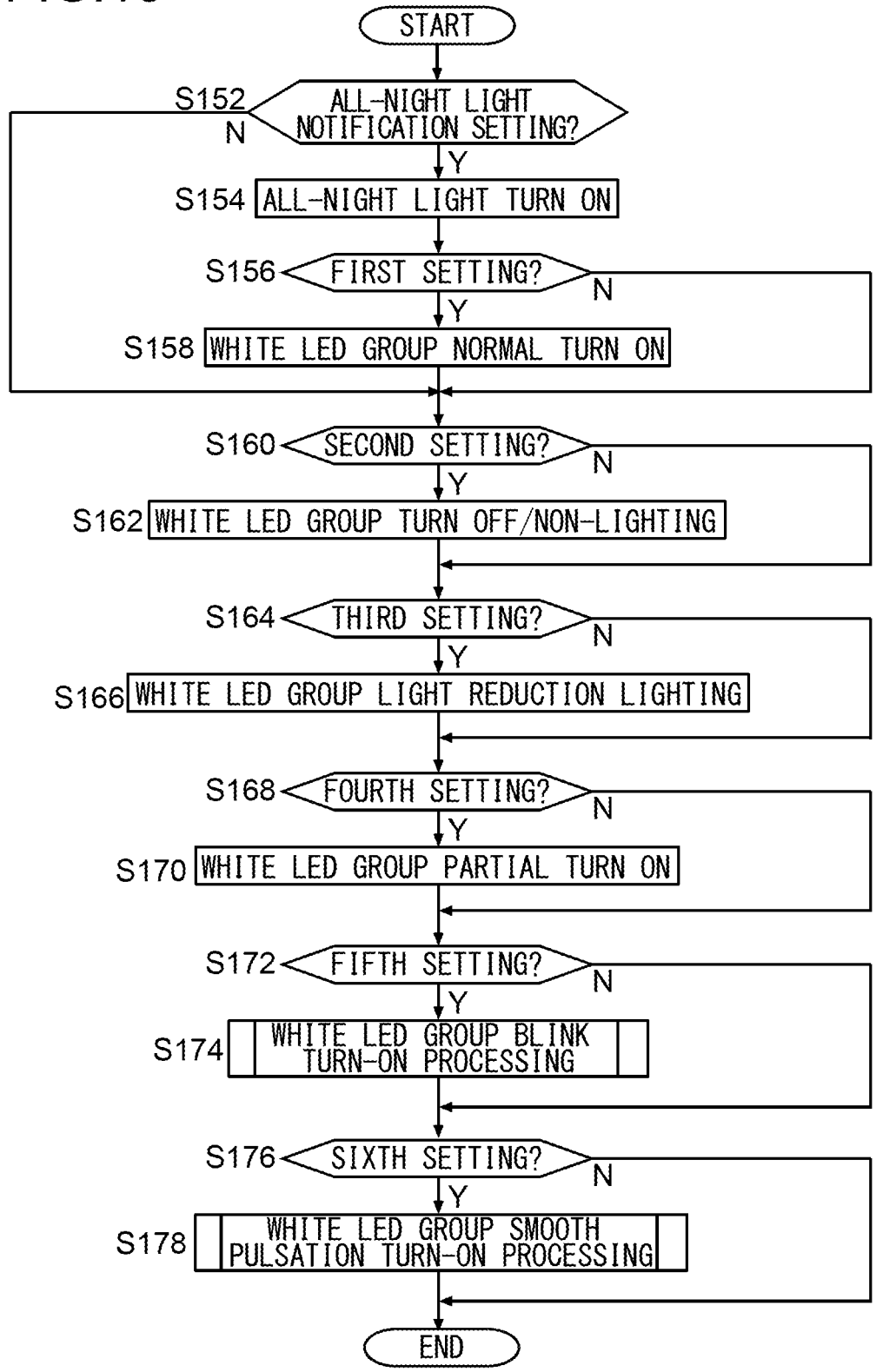
FIG. 10 A flowchart showing the details of step S144 shown in FIG. 9 and according to the second embodiment.

FIG. 10 is a flowchart showing the details of step S144 in the second embodiment shown in FIG. 9. When the flow starts, in step S152, whether or not a setting for utilizing the yellow (all-night light) LED 104 to provide a notification of the end of the life is made is checked. If the corresponding setting is made, the process proceeds to step S154 where the yellow LED 104, which is the all-night light, is turned on and the process moves to step S156 where whether or not the first setting is made is checked. Then, if the first setting is made, the process proceeds to step S158 where the division white LED group 114 is normally turned on, and the process proceeds to step S160. As described above, in the first setting, the notification of the end of the life of the division white LED group 114 is performed by turning on the yellow LED 104 without the lighting state itself of the division white LED group 114 being changed. Since, in general, the yellow LED 104 and the division white LED group 114 are not simultaneously turned on, this is recognized to be the notification of the end of the life. On the other hand, if, in step S156, the setting is not the first setting, the process directly moves to step S160. If, in step S152, the setting is not an all-night light setting, the process also directly moves to step S160.

Whether or not the first setting described above is performed may be previously set as the specification of its product when the LED lighting apparatus 4 is shipped or may be set when a user installs the LED lighting apparatus 4. The same is true for the second to sixth settings, which will be described later. The first to sixth settings cannot be set simultaneously; any one of them is selected and set. By contrast, whether or not an all-night light notification setting is made can be freely be set in combination with any of the second to sixth settings. As is obvious from the flow from step S152 to step S158, the normal lighting of the division white LED group 114 based on the first setting can only be combined with a case where the all-light night notification is provided.

In step S160, whether or not the second setting is made is checked. If the setting is the second setting, the process proceeds to step S162 where the lighting of the division white LED group 114 is disabled or if it is kept on, this is turned off and the process moves to step S164. On the other hand, if, in step S160, the setting is not the second setting, the process directly moves to step S164. As described above, the second setting can be combined with each of the case where the all-night light notification setting is made and the case where the all-night light notification setting is not made; if the process moves to step S162 without the all-night light notification setting being made, the notification of the end of the life is provided as in the first embodiment.

In step S164, whether or not the third setting is made is checked. If the setting is the third setting, the process proceeds to step S166 where the turn-on duty cycle of the division white LED group 114 is lowered (for example, to one-fourth of a normal one) and thus the division white LED group 114 is turned on with reduced brightness, and the process moves to step S168. On the other hand, if, in step S164, the setting is not the third setting, the process directly moves to step S168. As described above, the third setting can be combined with each of the case where the all-night light notification setting is made and the case where the all-night light notification setting is not made.

In step S168, whether or not the fourth setting is made is checked. If the setting is the fourth setting, the process proceeds to step S170 where part of the division white LED group 114 is turned on and the other parts are turned off, that is, partial lighting control is performed, and the process moves to step S172. In this case, in the partial lighting, unlike one-side lighting typical of normal lighting control, for example, division parts are turned on in a staggered manner, that is, partial lighting unique to the end of the life is performed. On the other hand, if, in step S168, the setting is not the fourth setting, the process directly moves to step S172. As described above, the fourth setting can be combined with each of the case where the all-night light notification setting is made and the case where the all-night light notification setting is not made.

In step S172, whether or not the fifth setting is made is checked. If the setting is the fifth setting, the process proceeds to step S174 where processing for providing an instruction to blink the division white LED group 114 is performed, and the process moves to step S176. On the other hand, if, in step S172, the setting is not the fifth setting, the process directly moves to step S176. As described above, the fifth setting can be combined with each of the case where the all-night light notification setting is made and the case where the all-night light notification setting is not made.

In step S176, whether or not the sixth setting is made is checked. If the setting is the sixth setting, the process proceeds to step S178 where processing for providing an instruction to make the brightness of the division white LED group 114 smoothly pulsate and change through change of duty is performed, and the flow is completed. On the other hand, if, in step S176, the setting is not the sixth setting, the flow is directly completed. As described above, the fifth setting can be combined with each of the case where the all-night light notification setting is made and the case where the all-night light notification setting is not made.

As a variation of the second embodiment described above, the yellow LED 104 of FIG. 8 may be changed to a red LED, and, instead of the all-night light, a special display unit for producing a display saying that the life ends may be provided. In this case, the all-night light control unit 102 is replaced by a life end notification controller unit. Moreover, in this case, the "all-night light" in steps S152 and S154 of FIG. 10 is replaced by the "red LED." Moreover, step S152 may be omitted, and, in any of the first to sixth settings, the red LED designed for the notification of the end of the life may be configured to be turned on.

Third Embodiment

Figure 11:
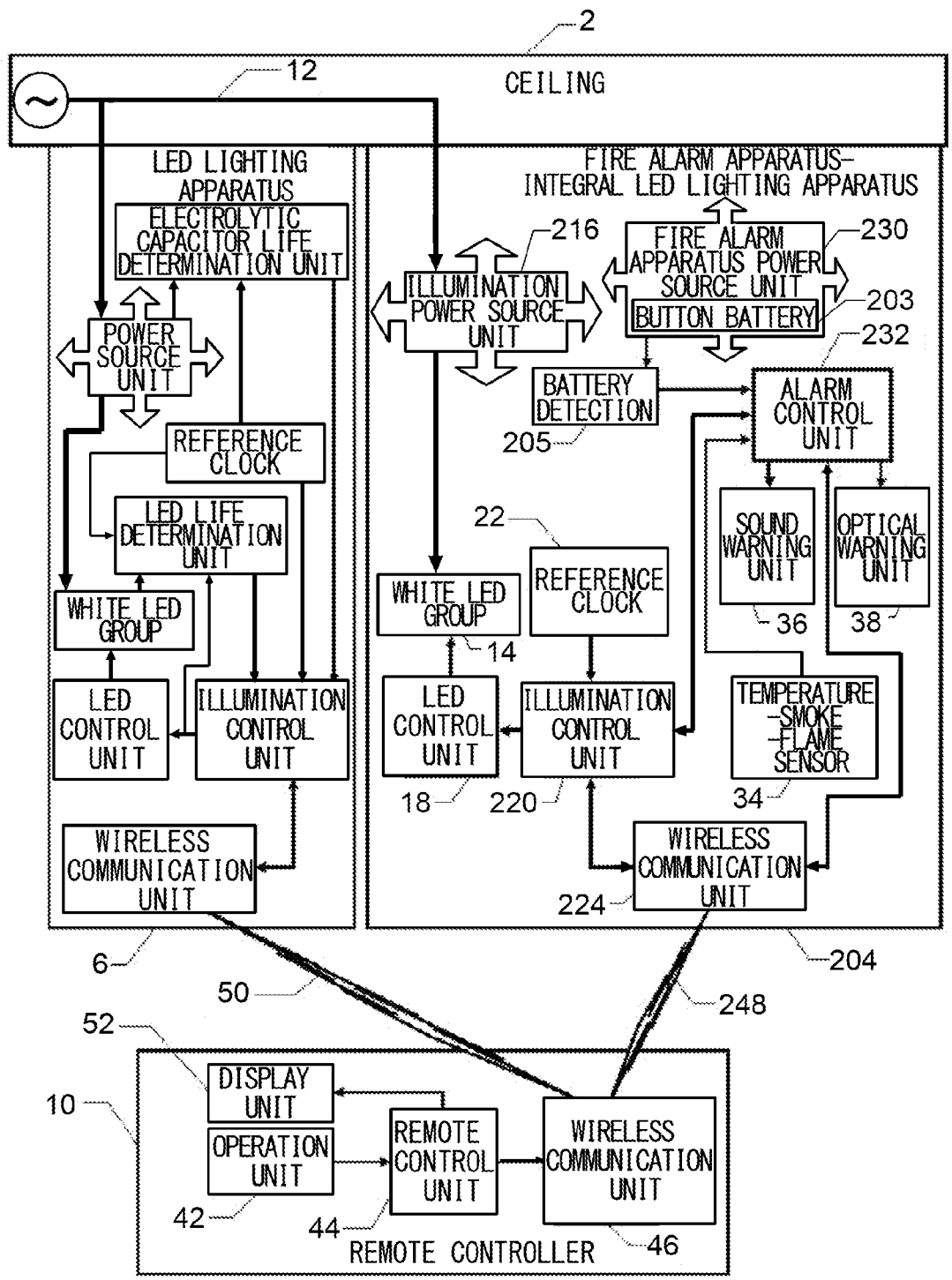
FIG. 11 A block diagram showing a third embodiment of an LED lighting system according to embodiments of the present invention (third embodiment)

FIG. 11 is a block diagram showing a third embodiment of an LED lighting system according to the embodiments of the present invention. In the third embodiment of FIG. 11, the same parts as in the first embodiment of FIG. 1 are identified with common reference numerals, and their descriptions will not be repeated unless necessary. In the third embodiment of FIG. 11, the LED lighting apparatus and the fire alarm apparatus are formed integrally as a fire alarm apparatus-integral LED lighting apparatus 204; it communicates with the remote controller 10 through a common wireless communication unit 224 by infrared light 248. As with the power source unit 16 of FIG. 1, an illumination power source unit 216 is powered from the electrical power line 12 whereas a fire alarm apparatus power source unit 230 is powered by a button battery 203.

In the third embodiment of FIG. 11, the LED life determination unit and the electrolytic capacitor life determination unit are further omitted, and, instead of them, a battery detection unit 205 for detecting the voltage of the button battery 203 is provided. Since the life of the button battery 203 that is of about ten years is the same as the lives of the electrolytic capacitor of the illumination power source unit 216 and of the white LED group 14, if the voltage of the button battery 203 is checked and then is detected to be lowered to a predetermined voltage or less, the entire life of the fire alarm apparatus-integral LED lighting apparatus 204 is determined to end. The battery detection unit 205 is started along with the turn-on operation and the light intensity adjustment operation of the white LED group 14, and thus the detection of the life of the fire alarm apparatus-integral LED lighting apparatus 204 and the daily check of the function of the fire alarm apparatus are performed, with the result that an failure to perform the operation when it needs to be performed is prevented. An alarm control unit 232 cooperates to perform the above function under the control of an illumination control unit 220.

Figure 12:
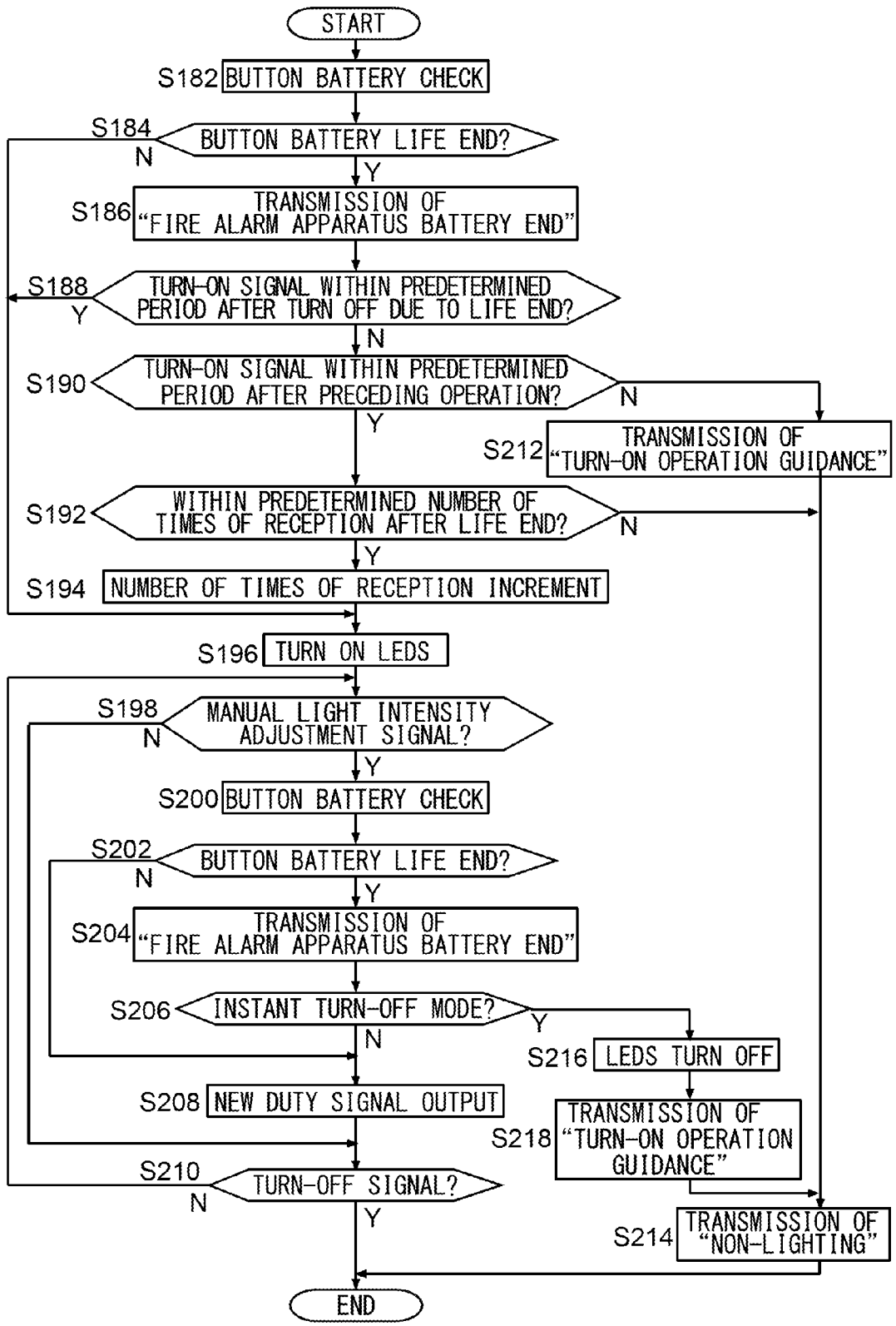
FIG. 12 A flowchart showing the basic function of an illumination control unit shown in FIG. 11 and according to the third embodiment.

FIG. 12 is a flowchart showing the function of the illumination control unit 220 shown in FIG. 11. As in the first embodiment, the flow starts by receiving the turn-on signal from the remote controller 10. When the flow starts, in step S182, the power supply voltage of the button battery 203 is checked by the battery detection unit 205 through the alarm control unit 232. Then, in step S184, whether or not the life of the button battery 203 ends is determined, and if the life ends, in step S186, a signal indicting that the power supply battery of the fire alarm apparatus runs out is transmitted to the remote controller 10.

Then, in step S188, whether or not the turn-on signal that makes the flow of FIG. 12 start is a turn-on signal of an operation that is performed within a predetermined period of time (for example, 30 seconds) after the white LED group 14 is turned off due to the end of the life of the button battery 203 is checked. This is because, when the white LED group 14 being kept on in the instant turn-off mode described later is suddenly turned off due to the end of the life of the button battery 203, relighting is conducted by performing the turn-on operation within a predetermined period of time.

If the operation is not the operation corresponding to step S188, the process proceeds to step S190 where whether or not the turn-on signal that makes the flow of FIG. 12 start is received within a predetermined period of time (for example, 1 second) after the preceding operation is checked. This is performed so that, even if the life of the button battery 203 is determined to end and the fire alarm apparatus-integral LED lighting apparatus 204 is not turned on by a normal turn-on operation, lighting can be carried out by performing a special operation, that is, continuously performing an operation at the intervals of one second or less. If the operation is the operation corresponding to step S190, the process proceeds to step S192 where, after the life of the button battery 203 is determined to end, whether or not the operation is an operation of a predetermined number of times (for example, five times) or less is checked. This is performed so that, for ease of use, even if the life of the button battery 203 ends, lighting performed by the special operation that is the continuous operation is allowed but a predetermined limit is placed on the number of times and the turn-on operation is prevented from being continued for a long time even though the life of the white LED group 14 is assumed to end due to the end of the life of the button battery 203.

If, in step S192, the operation is the operation of the predetermined number of times or less, the process proceeds to step S194 where the number of times of reception of an operation signal is incremented one time and the process proceeds to step S196 where the white LED group 14 is turned on. On the other hand, if, in step S184, the life of the button battery 203 is not determined to end, the process directly moves to step S196 where the white LED group 14 is immediately turned on. If, in step S188, the white LED group 14 is recognized to be the turn-on signal of the predetermined period of time or less after the white LED group 14 is turned off due to the end of the life of the button battery 203, the process also directly proceeds to step S196 where the white LED group 14 is turned on.

If, in step S196, the white LED group 14 is turned on, the process proceeds to step S198 where whether or not a manual light intensity adjustment signal is received from the remote controller 10 is checked. If it is received, the process proceeds to step S200 where the power supply voltage of the button battery 203 is checked. Then, in step S202, whether or not the life of the button battery 203 ends is determined, and, if the life ends, in step S204, a signal indicating the power supply battery of the fire alarm apparatus runs out is transmitted to the remote controller 10. In this way, the button battery 203 is checked not only at the time of the turn-on operation but also at the time of the light intensity adjustment operation. Furthermore, in step S206, at the moment when a determination signal indicating that the life of the button battery 203 ends is generated, whether or not the mode is set at a mode for turning off the white LED group 14 is checked. If the mode is not the instant turn-off mode, the white LED group 14 is not turned off, and the process proceeds to step S208. On the other hand, if, in step S202, the signal indicating that the life of the button battery 203 ends is not generated, the process directly moves to step S208.

In step S208, a new duty cycle signal based on the manual light intensity adjustment signal detected in step S198 is output, and the process moves to step S210. On the other hand, if, in step S198, the manual light intensity adjustment signal is not detected, the process directly moves to step S210. In step S210, whether or not the turn-off signal is received from the remote controller 10 is checked. If the turn-off signal is not received, the process returns to step S198, and thereafter, unless the turn-off signal is received and the signal indicating the life of the button battery 203 ends is generated in the instant turn-off mode, steps S198 to S210 are repeated to correspond to the light intensity adjustment control or the variation of the state of the life of the button battery 203. On the other hand, if, in step S210, the turn-off signal is recognized to be received, the flow is completed.

When the life of the button battery 203 ends, if, in step S190, it is not detected that the signal is the turn-on signal within a predetermined period of time after the preceding operation, the process proceeds to step S212 where an instruction signal of a guidance display saying that continuous operation allows lighting to be performed up to a predetermined number of times is transmitted to the remote controller 10, and the process moves to step S214. On the other hand, if, in step S192, it is detected that lighting is carried out by performing continuous operation a predetermined number of times or more, the process immediately moves to step S214. In both cases, the lighting corresponding to the turn-on operation is not performed, and, in step S214, information indicating "non-lighting" is transmitted to the remote controller 10 and the flow is completed. If, in step S206, the mode is the instant turn-off mode, the process moves to step S216 where the white LED group 14 is instantly turned off, and, in step S218, an instruction signal of a guidance display saying that relighting is allowed by performing the turn-on operation within a predetermined period of time is transmitted to the remote controller 10, and, furthermore, in step S214, information indicating "non-lighting" is transmitted to the remote controller 10 and the flow is completed.

In a variation of the third embodiment, when the entire life of the fire alarm apparatus-integral LED lighting apparatus 204 is determined, the button battery 203 of the alarm apparatus power source unit 230 is not used, a button battery designed for the determination of the life is further added, the voltage of the button battery 203 and the voltage of this button buttery designed for the determination of the life are checked and thus it is possible to determine the entire life of the fire alarm apparatus-integral LED lighting apparatus 204. When this type of button buttery designed for the determination of the life is added, a current corresponding to the turn-on current of the white LED group 14 is passed through the button buttery designed for the determination of the life, and thus the button buttery designed for the determination of the life corresponding to the degradation of the white LED group 14 may be consumed.

Furthermore, in FIG. 11, in the LED lighting apparatus 6, the LED life determination unit and the electrolytic capacitor life determination unit are also omitted, and the life of the LED lighting apparatus 6 may be determined by the consumption of the button buttery designed for the determination of the life. In this case, even if a plurality of LED lighting apparatuses within the same room are turned on under the same conditions for the same number of hours, with the variation of the life of the button battery, it is possible to prevent a plurality of LED lighting apparatuses within the same room from being turned off at the same time period due to the end of the life of LEDs, and consequently, a sufficient time period for replacing the LED lighting apparatus that is first turned off is given and then the subsequent LED lighting apparatus is turned off.

Fourth Embodiment

Figure 13:
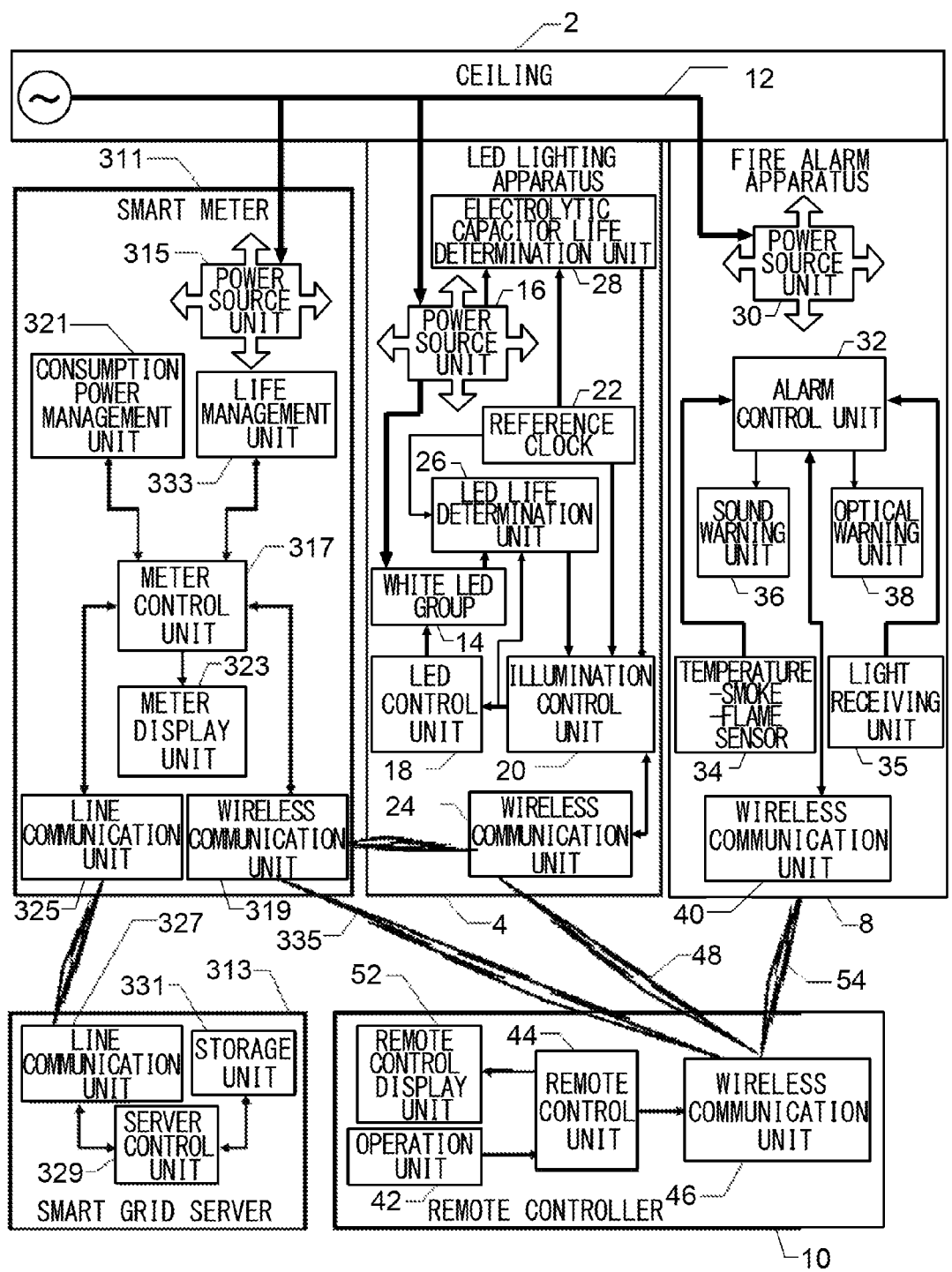
FIG. 13 A block diagram showing a fourth embodiment of an LED lighting system according to embodiments of the present invention (fourth embodiment)

FIG. 13 is a block diagram showing a fourth embodiment of an LED lighting system according to the embodiments of the present invention. Since the fourth embodiment has the same parts as the first embodiment, in FIG. 13, the same parts as in the first embodiment of FIG. 1 are identified with common reference numerals, and their descriptions will not be repeated unless necessary. The feature of the fourth embodiment of FIG. 13 is that a smart meter 311 which manages domestic power consumption and a smart grid server 313 which cooperates with the smart meter 311 by line communication are added. Although, in FIG. 13, for ease of illustration, only the LED lighting apparatus 4 is shown, and the LED lighting apparatus 6 and the like of FIG. 1 are omitted, the LED lighting system is the system that is similar to that of FIG. 1 and that includes a plurality of LED lighting apparatuses without any change.

In the fourth embodiment, the LED lighting apparatus 4 transmits information (corresponding to the amount of current supplied to the white LED group 14 through PWM control) on power consumed by the LED lighting apparatus 4 from the wireless communication unit 24 (for example, an infrared communication unit) to the outside. The smart meter 311 has a power source unit 315 that is powered from the electrical power line 12. A meter control unit 317 is powered from the power source unit 315, and is operated by a microcomputer that is operated by a reference clock and a predetermined program. The information on power consumed by the LED lighting apparatus 4 that is transmitted from the wireless communication unit 24 is received by a wireless communication unit 319 and is processed by a consumption power management unit 321 based on control by the meter control unit 317. The result of the processing is displayed, as a power consumption amount, on a meter display unit 323 for each of devices under management by the smart meter 311, and is transmitted by a line communication unit 325 through a communication line to the smart grid server 313.

The power consumption amount information transmitted from the smart meter 311 is received by a line communication unit 327 of the smart grid server 313, and is stored in a storage unit 331 by control by a server control unit 329. The smart grid server 313 (server control unit 329) communicates, as necessary, with the meter control unit 317, performs charge settlement processing for power used and performs deduction from a registered bank or the like.

Furthermore, in the smart meter 311, a life management unit 333 performs, based on control by the meter control unit 317, accumulative processing on the consumption power information of the LED lighting apparatus 4 received by the wireless communication unit 319. Then, when, based on the accumulative consumption power, the life management unit 333 determines that the life of the LED lighting apparatus 4 ends, it is displayed on the meter display unit 323, is transmitted to the wireless communication unit 46 of the remote controller 10 by infrared rays 335 through infrared communication and the end of life is displayed on the display unit 52. In addition to the life determination by the smart meter 311 as described above, the LED lighting apparatus 4 of the fourth embodiment of FIG. 13 can check the life two or three times since it has the LED life determination unit 26 and the electrolytic capacitor life determination unit 28 that are the same as in the first embodiment of FIG. 1. However, since, in the fourth embodiment, the smart meter 311 has the life determination function based on the accumulative consumption power, the LED lighting apparatus 4 itself can also correspond to the life determination of a simple LED lighting apparatus that does not include the LED life determination unit 26 and the electrolytic capacitor life determination unit 28.

When the smart meter 311 receives the power consumption amount information from a device that transfers life determination to the smart grid server 313, it is transmitted to the smart grid server 313 through line communication. The power consumption amount information received by the smart grid server 313 is accumulatively stored in the storage unit 331, and the server control unit 329 determines whether or not the life ends. Then, when, based on the accumulative consumption power that is stored and updated, the life of the device is determined to end, the server control unit 329 transmits information on the determination to the smart meter 311. The smart meter 311 transmits the received determination information on the end of life to the remote controller (for example, when the device is assumed to be the LED lighting apparatus 4, the remote controller 10) of the device by the infrared rays 335, and is displayed on the remote control display unit 52. By communication through the remote controller 10 or directly from the wireless communication unit 319 to the wireless communication unit 24, the information on the end of the life is transmitted, and an appropriate action such as for turning off the LED lighting apparatus 4 is taken.

Although, in the above description, the LED lighting apparatus 4, the smart meter 311 and the remote controller 10 communicate with each other by infrared wireless communication, this can be achieved by near field wireless communication through radio waves or by power line communication through the electrical power line 12.

Figure 14:
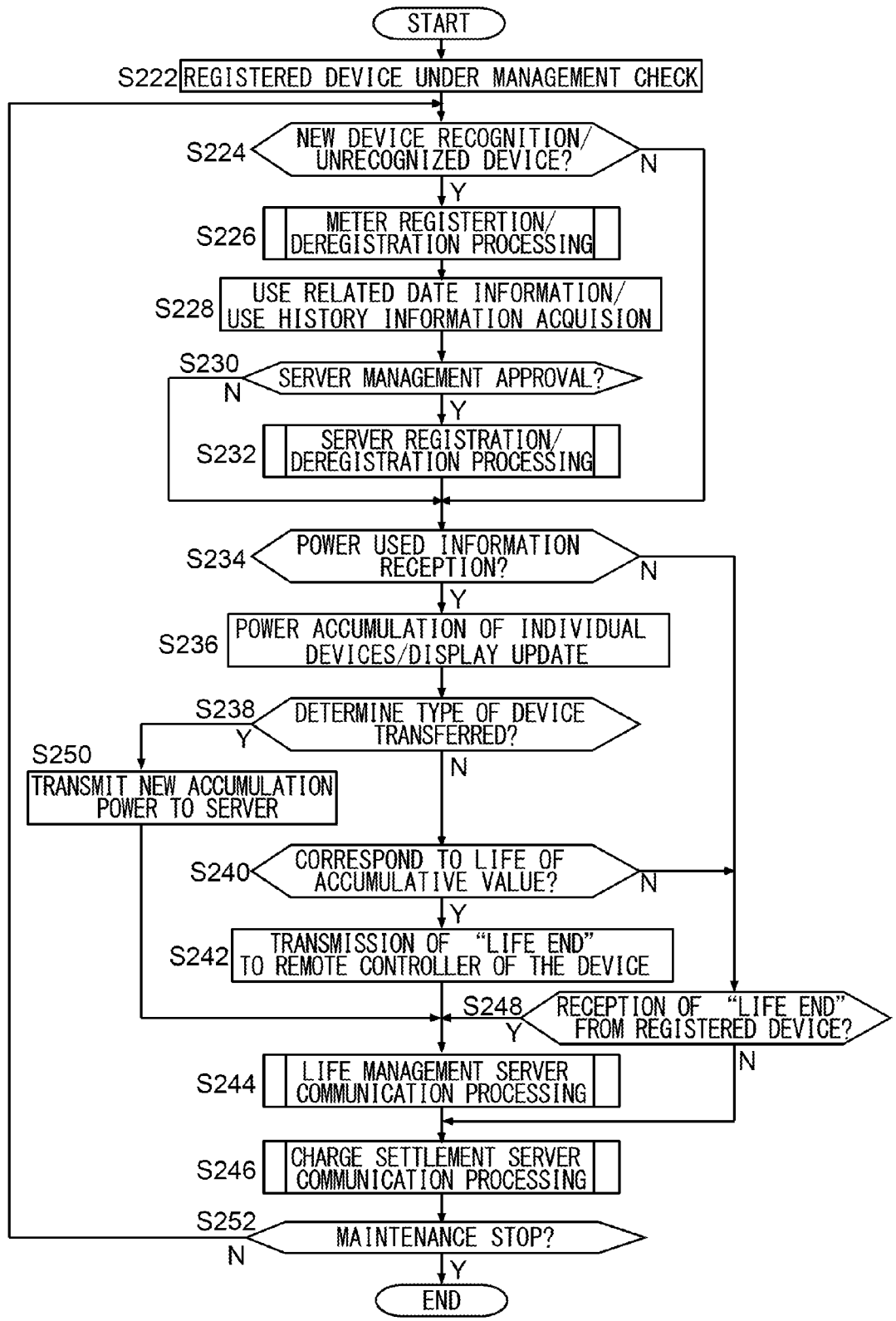
FIG. 14 A flowchart showing the basic function of a meter control unit shown in FIG. 13.

FIG. 14 is a flowchart showing the basic function of the meter control unit 317 shown in FIG. 13. The flow starts by the application of electricity to the smart meter 311. First, in step S222, a registered device under management by the smart meter 311 is checked. Then, based on this, in step S224, whether or not the addition of a new device to the system is recognized is checked. Moreover, whether or not there is a device that has been registered but has not been recognized is checked. If the corresponding device is present, the process proceeds to step S226 where the meter registration of the new device and deregistration processing on the unrecognized device are performed, and the process moves to step S228.

In step S228, use related date information and use history information are acquired from the newly registered device. These types of information are important especially when the device is a used device; these types of information are acquired from the storage unit of the device. When information indicating that the device is new is acquired, the time when recognition is made in step S224 is assumed to be a date when the use is started. In the deregistered device, the date detected in step S224 is assumed to be a date when the use is completed. Actual use result information such as past accumulative consumption power information in the used device applies for the use history information.

If the processing for acquiring the use related date information and the use history information is completed in step S228, the flow proceeds to step S230 where whether or not the user approves the management of the device through the smart grid server 313 is checked, and then, if the approval is received, in step S232, communication with the smart grid server 313 is performed, server registration and deregistering processing are performed and the process moves to step S234. On the other hand, if, in step S230, server management approval is not recognized, the process directly moves to step S234. As described above, in consideration of privacy, when the user does not desire, detailed information on each device is stored in the smart meter 311, and information other than a total power use amount necessary for charge settlement is prevented from leaking to the outside. If, in step S224, neither the recognition of a new device nor the detection of an unrecognized but registered device is performed, the process directly moves to step S234.

If, in the server registration/deregistration processing performed in step S232, information indicating deregistration is transmitted to the smart grid server 313, information on the type of device to be newly bought and the related type of device is transmitted back from the smart grid server 313 accordingly. As described above, the smart grid server 313 grasps, based on the approval of the user, the stop of the use of the device and scrap information, and can use them as analysis data for the actual use result information about the sold product and as information for introducing a new product. The same information on the type of device to be newly bought is received from the smart grid server 313 when the smart grid server 313 grasps information indicating that the life of the device ends; this will be described later.

In step S234, whether or not information on power used is newly received from a registered device under management is checked. This information on power used is transmitted from each device every predetermined period of time or each time a predetermined amount of power is used. If the information on power used is received, the process proceeds to step S236 where power used is accumulatively summed for each device, and a display of power used on the meter display unit 323 is updated. Then, in step S238, whether or not the device is a device that transfers life determination to the smart grid server 313 is checked, and, if not, the process moves to step S240 so that a determination is made within the smart meter 311.

In step S240, whether or not an accumulative value of the power used that is updated in step S236 corresponds to a life value is checked, and, if so, in step S242, a signal indicating "the end of life" is transmitted to the remote controller of the device, and the process moves to step S244. In step S244, communication processing on life management with the smart grid server 313 is performed in a predetermined procedure, and the details thereof will be described later. Then, in step S246, communication processing for the settlement of a charge of the power used with the smart grid server 313 is performed. The details of this processing include checking whether or not a regular settlement date such as once every month is reached, and a charge settlement procedure for performing deduction from a bank account. if the date is reached.

On the other hand, if, in step S234, the information on the power used is not detected to be newly received, the process moves to step S248 where whether or not information indicating "the end of life" is received from the registered device is checked. For example, this corresponds to the determination information by the LED life determination unit 26 or the electrolytic capacitor life determination unit 28 of the LED lighting apparatus 4. If these types of information are received, the process moves to the life management server communication processing in step S244, and the processing described above is performed. On the other hand, if, in step S248, the reception of the information indicating "the end of life" is not detected, the process moves to the charge settlement server communication processing in step S246, and the processing described above is performed. If, in step S238, the device is detected to be the device that transfers life determination to the smart grid server 313, the process moves to step S250 where new accumulative power information in step S236 is transmitted to the smart grid server 313, and the process moves to the life management server communication processing.

If, in step S246, the charge settlement server communication processing is completed, the flow moves to step S252 where whether or not an operation for stopping the smart meter 311 to perform maintenance is performed is checked. If the operation is not detected, the process returns to step S224. Thereafter, unless the maintenance stop operation is not detected, steps S224 to S252 are repeated. On the other hand, if, in step S252, the stop of the maintenance is detected, the flow is completed.

Figure 15:
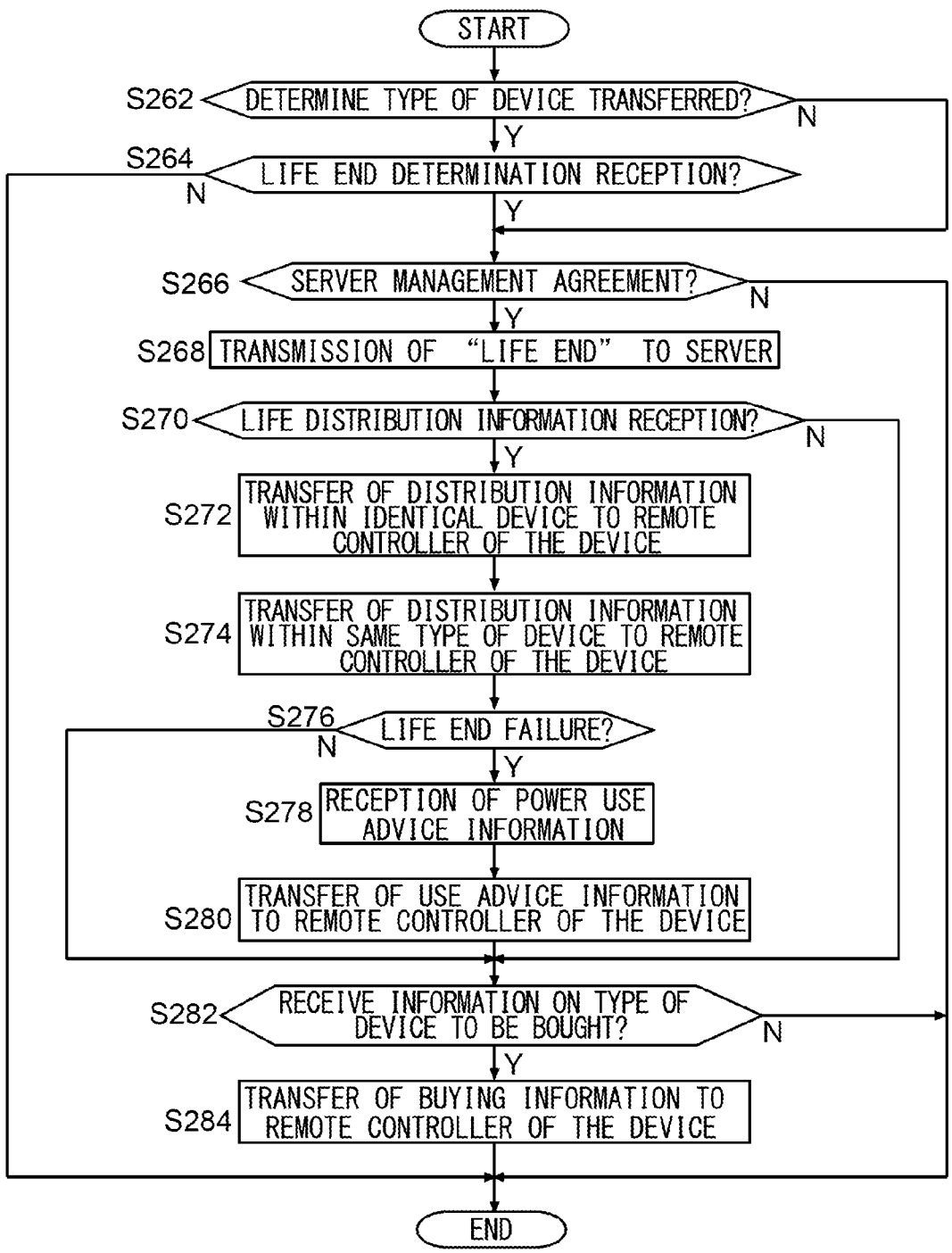
FIG. 15 A flowchart showing the details of step S244 in the flow of FIG. 14.

FIG. 15 is a flowchart showing the details of the life management server communication processing performed in step S244 in the flow of FIG. 14. When the flow starts, in step S262, whether or not the type of device is the type of device that transfers life determination is checked, and, if so, in step S264, whether or not a determination of whether the life ends is received is checked. If the reception is not performed, the flow is immediately completed. On the other hand, if the determination of whether the life ends is received, the process moves to step S266. If, in step S262, the type of device is not the type of device that transfers determination, based on the information indicating the end of the life grasped within the smart meter 311, this means the start of the flow of FIG. 15, and the process directly moves to step S266.

In step S266, whether or not the user agrees with management by the smart grid server 313 is determined, and, if the determination cannot be performed, the flow is immediately completed. In this case, communication with the smart grid server 313 is not performed. On the other hand, if, in step S266, the user is determined to agree with the server management, in step S268, the information indicating "the end of the life" of the device is transmitted to the smart grid server 313 where the process moves to step S270.

In step S270, whether or not life distribution information is received from the smart grid server 313 is checked. This information is information that indicates distribution obtained by performing statistical processing on life information collected in the smart grid server 313 managing a large number of devices and in which position the own device is located therein. If this type of information is received, the process proceeds to step S272 where distribution information within the identical device (the device of the same type number made by the same maker) is transferred to the remote controller 10 in charge of the device. In step S274, distribution information within the same type of device (the same type of device including those of other makers) as the device is transferred, and the process moves to step S276.

In step S276, in the information in steps S272 and S274, whether or not the life of the own device is significantly and abnormally short is checked, and, if so, power use advice information based on this is received in step S278, this is transferred to a remote controller (for example, the remote controller 10) in charge of the device in step S280 and the process moves to step S282. This advice is a piece of advice that is suitable for each device and that prevents the status of use which can cause the life to become short. If the user checks this advice and does not agree with it, the user can make an inquiry based on the information received in steps S272 and S274. If, in step S270, the life distribution information is not received or in step S276, the life end abnormality does not apply, the process moves to step S282 at the point in either case.

In step S282, whether or not the information on the type of device to be newly bought is received is checked, and, if it is received, in step S284, this is transferred to a remote controller (for example, the remote controller 10) in charge of the device, and the flow is completed. The information on the type of device to be newly bought may be collected by the smart grid server 313 itself or may be access information to a special site that collects information on the same type of device of each maker and the related type of device and that compares their specifications and prices.

The technical features disclosed in the present specification will be summarized below.

<First Technical Feature>

A first technical feature disclosed in the present specification relates to an lighting apparatus. An object of the first technical feature is to provide an lighting apparatus that can appropriately perform life management.

To achieve the object, the first technical feature disclosed in the present specification is to provide a lighting apparatus including: a light source unit; a power source unit that supplies power to the light source unit; a power source unit ability detection unit; and a power source unit life determination unit that determines the life of the power source unit based on the detection by the power source unit ability detection unit. Thus, it is possible to safely use a lighting apparatus that can be used for a long period of time.

In the specific feature, the power source unit receives electric power from an alternating-current power line and includes a rectifier unit and an electrolytic capacitor that smoothes an output from the rectifier unit, and the power source unit ability detection unit detects the deterioration of the smoothing ability of the electrolytic capacitor. Thus, it is possible to appropriately manage the life of the electrolytic capacitor, which is particularly problematic in the power source unit.

In another specific feature, the lighting apparatus includes a notification unit that provides a notification of the determination result of the power source life determination unit to the outside. Thus, it is possible to varyingly and appropriately manage the life determination result. In another specific feature, the lighting apparatus includes a controller unit that provides a notification of the determination result by controlling the light source unit based on the determination result of the power source life determination unit. Thus, it is possible to intuitively recognize the end of the life of the lighting apparatus. In s more specific feature, based on the determination result, the controller unit disables the light source unit from emitting light or stops the light emission by the light source unit.

The first technical feature described above is suitable when the light source unit is an LED light source unit. The LED light source unit has a longer life than that of a fluorescent lamp or the like and can be used longer than the life of the power source unit when the age deterioration of its brightness is not important; the lighting apparatus can be used without the end of the life being realized. The first technical feature described above is significant in safely using such a lighting apparatus that can be used for a long period of time. In a more specific feature, the lighting apparatus includes an LED life determination unit that determines the life of the LED light source unit; this prevents a health disadvantage or the like caused by continuously using the lighting apparatus without a reduction in the brightness of the LED light source unit due to age deterioration being realized.

Another feature is to provide a lighting apparatus including: an LED lighting source unit; a power source unit that supplies power to the LED light source unit; and an LED life determination unit that determines the life of LEDs by summing the amount of energy input from the power source unit into the LED light source unit. Thus, it is possible to prevent a health disadvantage or the like caused by continuously using the lighting apparatus without a reduction in the brightness of the LED light source unit due to age deterioration being realized.

In a specific feature, the LED life determination unit includes a nonvolatile counter that sums the amount of energy input from the power source unit into the LED light source unit. Thus, it is possible to count the life by appropriately summing the actual use result even if power supply is temporarily stopped due to a power failure, the transfer of the lighting apparatus or the like.

In another specific feature, the lighting apparatus includes: a controller unit that controls light emission by the LED light source unit; and a reference clock unit that provides a reference clock to the controller unit, in which the LED life determination unit sums the amount of energy input into the LED light source unit. based on the reference clock. Thus, it is possible to appropriately count the life with a simple configuration. In a more specific feature, the LED life determination unit includes a counter that counts pulses based on the reference clock while the energy is being input into the LED light source unit.

In a further specific feature, the LED life determination unit adjusts the pulse count based on the reference clock according to the amount of energy input into the LED light source unit per unit time. In another specific feature, the lighting apparatus includes temperature measurement means for measuring the temperature of the LED light source unit, in which the LED life determination unit adjusts the pulse count based on the reference clock according to the temperature measurement means. Thus, it is possible to count the life close to the actual result of age deterioration of the LED light source unit.

Another feature is to provide a lighting apparatus including: an LED light source unit; a power source unit that supplies power to the LED light source unit; an LED life determination unit that determines the life of the LED light source unit; and a power source unit life determination unit that determines the life of the power source unit. Thus, it is possible to appropriately manage the long lives of the LED light source unit and the power source unit.

As described above, according to the first technical feature disclosed in the present specification, there is provided a lighting apparatus that can appropriately perform life management, <Second Technical Feature>

A second technical feature disclosed in the present specification relates to an lighting apparatus. An object of the second technical feature is to provide an lighting apparatus that can appropriate life management.

To achieve the object, the second technical feature disclosed in the present specification is to provide a lighting apparatus including: an LED light source unit; a power source unit that supplies power to the LED light source unit; an LED life determination unit that determines the life of the LED light source unit; and a notification controller unit that controls light emission by the LED light source unit based on the determination by the LED life determination unit and that provides a notification of the life of the LED light source unit. Thus, it is possible to intuitively provide a notification of the life with the LED light source unit itself whose life is to be determined.

Another feature is to provide a lighting apparatus including: an LED light source unit; a power source unit that supplies power to the LED light source unit; a power sour unit life determination unit that determines the life of the power source unit; and a notification controller unit that controls light emission by the LED light source unit based on the determination of the power source life determination unit and that provides a notification of the life of the power source unit. Thus, it is possible to intuitively provide, with the LED light source unit itself, a notification of the life of the power source unit, which may be dangerous if continuously used after the end of the life.

In a specific feature, when the notification controller unit provides notifications of life based on the determination by the LED life determination unit and the determination by the power source unit life determination unit, a difference between the notifications of life based on the determinations by the both is made. Thus, it is possible to appropriately provide both a notification of the life of the LED light source unit, which is not urgently dangerous if continuously used and a notification of the life of the power source unit, which may be dangerous.

In another specific feature, the notification controller unit provides a notification of life by failing to turn on the LED light source unit, blinking the LED light source unit, pulsating and turning on the LED light source unit, reducing light emitted by the LED light source unit or partially turning on the LED light source unit. Thus, it is possible to appropriately provide a notification that the lighting apparatus is different in lighting from that at the time of normal lighting. The notification methods described above may be previously selectable. In another specific feature, the notification controller unit provides a notification either when an instruction to turn on the LED light source unit is provided or when the life determination is performed. Thus, it is possible to provide a notification with timing that allows the user to notice it.

Another feature is to provide a lighting apparatus including: an LED light source unit; a power source unit that supplies power to the LED light source unit; a plurality of life determination units that determine the lives of a plurality of lighting functions; and a notification controller unit that controls light emission by the LED light source unit in a method corresponding to the determination result of each of the life determination units and that provides a notification of the life of the lighting function. Thus, it is possible to provide a notification of life corresponding to the characteristics of a plurality of portions of the lighting apparatus whose life ends. Examples of the plurality of portions are the LED lighting unit and the power source unit.

Another feature is to provide a lighting apparatus including: an LED light source unit; a power source unit that supplies power to the LED light source unit; a life determination unit that determines the life of a lighting function; a storage unit that stores the determination by the life determination unit; an instruction unit that provides an instruction to turn on the LED light source unit; and a notification controller unit that controls light emission by the LED light source unit based on memory in the storage unit when the instruction to turn on the LED light source unit is provided and that provides a notification of the life of the LED light source unit. Thus, it is possible to prevent the LED light source unit being normally kept on in daily life from being suddenly turned on for the notification of life based on the life determination result, and to provide a notification of life when a turn-on instruction is provided in the subsequent round.

Another feature is to provide a lighting apparatus including: an LED light source unit; a power source unit that supplies power to the LED light source unit; a life determination unit that determines the life of a lighting function; a notification controller unit that controls light emission by the LED light source unit based on the determination by the LED life determination unit and that provides a notification of the life of the LED light source unit; and a restoring controller unit that cancels the control on the LED light source unit by the notification controller unit and that restores the LED light source unit to a normal light emission state. This allows the user who recognizes the notification of life to continuous normal lighting for the time being until the replacement of the lighting apparatus.

In a specific feature, in the restoring controller unit, the number of times of cancellation of the control on the LED light source unit is limited. This prevents the cancellation operation originally designed for temporary convenience from being repeated a large number of times and therefore maintains the significance of the notification of life. In another specific feature, in the restoring controller unit, a time period during which the control on the LED light source unit can be cancelled is limited. Thus, it is possible to easily restore the LED light source unit to a normal light emission state only in a predetermined period of time after the notification of life is provided, with the result that temporary convenience is achieved.

In another specific feature, the life determination unit has a plurality of life determination units for determining the lives of a plurality of lighting functions, and, in the restoring controller unit, the cancellation of the control on the LED light source unit is limited according to the determination result of each of the plurality of life determination units. The allowance of the cancellation can be varied according to the degree of seriousness of the determination of life. In a further specific feature, the plurality of life determination units includes an LED life determination unit that determines the life of the LED light source unit and a power source unit life determination unit that determines the life of the power source unit. In a further specific feature, the restoring controller unit allows the cancellation of the control on the LED light source unit based on the life determination result of the LED light source unit because it is not dangerous for time being but does not allow the cancellation of the control on the LED light source unit based on the life determination result of the power source unit life determination unit.

As described above, according to the second technical feature disclosed in the present specification, there is provided a lighting apparatus that can appropriately perform life management, <Third Technical Feature>

A third technical feature disclosed in the present specification relates to an electrical device management system. An object of the third technical feature is to provide an electrical device management system that can appropriately perform management.

To achieve the object, the third technical feature disclosed in the present specification is to provide an electrical device management system including: a first LED illumination unit; a second LED illumination unit; and a management unit that performs management such that, when the lives of the first LED illumination unit and the second LED illumination unit end, these units are prevented from simultaneously leaving a normal lighting state. Thus, it is possible to avoid a disadvantage to lighting environments resulting from a plurality of LED illumination units being simultaneously turned off due to the end of their lives. The LED illumination unit is gradually decreased in brightness but is not suddenly turned off at a certain point; the continuous use of the LED illumination unit without a decrease in brightness being noticed causes a problem. The management described above is useful when the minimum notification of life is provided while simultaneous turning off and the like are being prevented.

A specific feature is that the management unit includes: a life determination unit that determines the life of the first LED illumination unit; a life notification unit that changes, when the life determination unit determines that the life of the first LED illumination unit ends, the first LED illumination unit from a normal illumination state to a life notification state so as to provide a notification of the end of the life; and a controller unit that holds the notification by the life notification unit when the life of the first LED illumination unit is determined to end with the life of the second LED illumination unit determined to end. Thus, it is possible to prevent the first LED illumination unit and the second LED illumination unit from simultaneously leaving a normal lighting state. In a more specific feature, the life notification unit intuitively provides a notification of life by preventing the first LED illumination unit from being turned on in the life notification state.

Another feature is to provide an electrical device management system including: a first LED illumination unit; a second LED illumination unit; a life determination unit that determines the life of the first LED illumination unit using a criterion different from that for determination of the life of the second LED illumination unit; and a life notification unit that changes, when the life determination unit determines that the life of the first LED illumination unit ends, the first LED illumination unit from the normal illumination state to the life notification state so as to provide a notification of the end of the life. Thus, when the end of the lives of the first LED illumination unit and the second LED illumination unit prevents these units from simultaneously leaving the normal lighting state.

In a specific feature, the criterion of the life notification unit is so set as to have random variation components, and thus the criterion for the determination of the life of the first LED illumination unit can be different from that for the determination of the life of the second LED illumination unit.

In another specific feature, the first LED illumination unit and the second LED illumination unit each have a life measuring battery, and the life notification unit determines the life of the first LED illumination unit based on the consumption of the battery. In this configuration, with variation components of the life of the battery, the criterion for the determination of the life of the first LED illumination unit can be different from that for the determination of the life of the second LED illumination unit. In a further specific feature, the electrical device management system is provided with a fire alarm apparatus, the life measuring battery included in the first LED illumination unit is also used as a power supply for this fire alarm apparatus and the life management of the first LED illumination unit is suitably made to cooperate with the fire alarm apparatus.

Another feature is to provide an electrical device management system including: an LED illumination unit; a fire alarm apparatus; a life determination unit that determines the life of the LED illumination unit; and a controller unit that performs a test with the function of the life determination unit made to cooperate with the function of the fire alarm apparatus. The life determination function of the LED illumination unit and the function determination of the fire alarm apparatus, which continue for a long period of time, are made to cooperate with each other, and this suitably prevents the occurrence of an unpredictable event such as an event in which a necessary function does not work when it is required because a test is ignored. In a specific feature, when the controller unit receives either of an instruction to test the function of the life determination unit and an instruction to test the function of the fire alarm apparatus, the controller unit automatically provides an instruction to test the function of the other.

Another feature is to provide an electrical device management system including: an illumination unit; a fire alarm apparatus; and a controller unit that tests the function of the fire alarm apparatus in association with the normal turn-on control operation of the illumination unit. Thus, the fire alarm apparatus is tested on a daily basis, and it is therefore possible to prevent the occurrence of an unpredictable event such as an event in which the fire alarm apparatus does not work when it is required. In a specific feature, the electrical device management system is provided with a life determination unit that determines the life of the illumination unit, and the controller unit tests the function of the life determination unit in association with the normal turn-on control operation of the illumination unit. Thus, in units, such as the illumination unit and the power source unit, whose life needs to be managed for a long period of time, its life management function is tested along with the fire alarm apparatus on a daily basis.

Another feature is to provide an electrical device management system including: an information acquisition unit that acquires consumption power information on an electrical device; a meter that measures consumption power charge based on the consumption power information acquired by the information acquisition unit; and a life determination unit that determines the life of the electrical device based on the consumption power acquired by the information acquisition unit. Thus, with the measurement of the consumption power charge, it is possible to manage the life of the electrical device under management by the meter. In a specific feature, the electrical device management system is provided with a notification unit that provides a notification of the determination result of the life determination unit to the electrical device.

Another feature is to provide an electrical device management system including: an information acquisition unit that acquires consumption power information on an electrical device; a meter that measures a consumption power charge based on the consumption power information acquired by the information acquisition unit; a communication unit that transmits to an outside server the consumption power charge measured by the meter; and a life information acquisition unit that transmits, through the communication unit, to the outside server, the consumption power of each electrical device and that receives life determination information on each electrical device that is returned as a response to the above transmission. Thus, it is possible not only to make a settlement of an electrical charge but also to entrust, as necessary, the life management of each electrical device.

As described above, according to the third technical feature disclosed in the present specification, there is provided an electrical device management system that can appropriately perform management,

INDUSTRIAL APPLICABILITY

The present invention can be applied to the life management or the like of an electrical device such as an LED lighting apparatus or a lighting apparatus including an electrolytic capacitor.

Other Variations

The implementation of various features of the present invention described above is not limited to the implementation of the embodiments described above; as long as advantages thereof are utilized, various other embodiments are possible. For example, although the embodiments discusses the management of the LED lighting apparatus, various features of the management of the electrical devices are useful in the management of other lighting apparatuses or electrical devices other than lighting apparatuses. Therefore, the following claims are intended to include any variation of the present invention in a technical scope without departing from the spirit and technical view of the present invention.

LIST OF REFERENCE NUMERALS

4 First LED illumination unit
6 Second LED illumination unit
20 and 120 Management unit
26 Life determination unit
20 and 120 Life notification unit
20 and 120 Control unit
203 Battery
8 and 204 Fire alarm apparatus
311 Meter unit
319 Information acquisition unit
321 Meter
333 Life determination unit
319 Notification unit
325 Communication unit
317 and 325 Life information acquisition unit
14 and 114 (LED) light source unit
16 Power source unit
84 Power source unit ability detection unit
16 Power source unit life determination unit
58 Rectifier unit
60 Electrolytic capacitor
24 Notification unit
20 Control unit
14 LED light source unit
26 LED life determination unit
72 Nonvolatile counter
22 Reference clock unit
80 Temperature measurement means
26 LED life determination unit
20 and 120 Notification controller unit
28 Power source unit life determination unit
24, 20 and 120
    Restoring controller unit
20 and 120 Storage unit

What is claimed is:
1. An electrical device management system of an electrical device comprising:

an information acquisition unit that acquires information of electric power consumed by the electrical device;

a meter that measures electric power charge for the use of the electric power for payment based on the information acquired by the information acquisition unit; and a life determination unit that determines the life of the electrical device based on accumulation of the information acquired by the information acquisition unit, whereby the information of payment for the use of the electric power by the electrical device is accumulated and utilized for life determination of the electrical device.

2. The electrical device management system according to claim 1 further comprising a notification unit that provides the electrical device with a notification of the life thereof determined by the life determination unit.

3. The electrical device management system according to claim 2, wherein the notification unit is arranged to provide the notification of the life of the electrical device to a remote controller of the electrical device.

4. The electrical device management system according to claim 1 further comprising a communication unit that transmits to an outside server the electric power charge measured by the meter.

5. The electrical device management system according to claim 1 wherein the life determination unit includes therein a function unit that determines the life of the electrical device based on the information acquired by the information acquisition unit.

6. The electrical device management system according to claim 1 wherein the life determination unit is arranged to transmit to an outside server the information acquired by the information acquisition unit and to receive from the outside server the life of the electrical device which is determined by the outside server based on the information transmitted to the outside server.

7. The electrical device management system according to claim 6 further comprising a notification unit that provides the electrical device with a notification of the life thereof received from the outside server.

8. The electrical device management system according to claim 7, wherein the notification unit is arranged to provide the notification of the life of the electrical device to a remote controller of the electrical device.

9. An electrical device management system of an electrical device comprising:

an information acquisition unit that acquires information of electric power consumed by the electrical device;

a meter that measures electric power charge based on the information acquired by the information acquisition unit;

a life determination unit that determines the life of the electrical device based on the information acquired by the information acquisition unit; and an outside server which includes:

a receiver unit that receives the information acquired by the information acquisition unit;

a function unit that determines the life of the electrical device based on the information received by the receiver unit; and a transmitter unit that transmits the life of the electrical device determined by the function unit to the life determination unit.

10. An electrical device management system of an electrical device comprising:

an information acquisition unit that acquires information of electric power consumed by the electrical device;

a meter that measures electric power charge based on the information acquired by the information acquisition unit;

a life determination unit that determines the life of the electrical device based on the information acquired by the information acquisition unit; and an outside server which includes:

a receiver unit that receives the life of the electrical device from the life determination unit and also receives other life determination information from a number of other electrical devices;

a function unit that obtains distribution information on the life determination information received by the receiver unit; and a transmitter unit that transmits the distribution information to the life determination unit.

11. An electrical device management system having a server comprising:

a receiver unit that receives information of electric power consumed by an electrical device;

a function unit that determines life of the electrical device based on accumulation of the information received by the receiver unit;

a transmitter unit that transmits back the life of the electrical device determined by the function unit; and a meter that measures electric power charge for the use of the electric power by the electrical device for payment based on the information of electric power consumed by the electrical device, wherein the meter is arranged to transmit the information of electric power consumed by the electrical device to the server and to receive the life of the electrical device from the server, whereby the information of payment for the use of the electric power by the electrical device is accumulated and utilized for life determination of the electrical device.

12. The electrical device management system according to claim 11, wherein the meter is arranged to provide the electrical device with a notification of the life thereof received from the server.

13. The electrical device management system according to claim 12, wherein the meter is arranged to provide the notification of the life of the electrical device to a remote controller of the electrical device.

* * * * *